United States Patent [19]

Murray et al.

[11] Patent Number: 5,545,515

[45] Date of Patent: Aug. 13, 1996

[54] ACRYLONITRILE COMPOUNDS AS CO-DEVELOPERS FOR BLACK-AND-WHITE PHOTOTHERMOGRAPHIC AND THERMOGRAPHIC ELEMENTS

[75] Inventors: Thomas J. Murray, St. Paul; Sharon M. Simpson, Lake Elmo, both of Minn.

[73] Assignee: Minnesota Mining and Manufacturing Company, St. Paul, Minn.

[21] Appl. No.: 529,982

[22] Filed: Sep. 19, 1995

[51] Int. Cl.$^6$ .................................................. G03L 1/498
[52] U.S. Cl. .......................... 430/617; 430/264; 430/300; 430/348; 430/353; 430/619; 430/944; 430/945
[58] Field of Search .................................. 430/619, 617, 430/264, 300, 348, 350, 357, 945, 944, 293, 353

[56] References Cited

U.S. PATENT DOCUMENTS

| | | | |
|---|---|---|---|
| 3,457,075 | 7/1969 | Morgan et al. | 96/67 |
| 3,667,958 | 6/1972 | Evans | 96/114.1 |
| 3,751,252 | 8/1973 | Smith et al. | 96/63 |
| 3,751,255 | 8/1973 | Wilson et al. | 96/66 R |
| 3,794,488 | 2/1974 | Henn et al. | 96/50 R |
| 3,839,049 | 10/1974 | Simons | 96/114.6 |
| 3,846,136 | 11/1974 | Sullivan | 96/114.1 |
| 3,887,376 | 6/1975 | Wilson et al. | 96/66 R |
| 3,893,863 | 7/1975 | Wilson et al. | 96/65 |
| 3,933,507 | 1/1976 | von Konig et al. | 96/114.1 |
| 3,994,732 | 11/1976 | Winslow | 96/114.1 |
| 4,021,249 | 5/1977 | Noguchi et al. | 96/114.1 |
| 4,082,901 | 4/1978 | Laridon et al. | 428/480 |
| 4,260,677 | 4/1981 | Winslow et al. | 430/618 |
| 4,269,929 | 5/1981 | Nothnagle . | |
| 4,735,884 | 4/1988 | Tsukahara et al. | 430/138 |
| 4,772,531 | 9/1988 | Tsukahara et al. | 430/138 |
| 4,798,790 | 1/1989 | Thomson et al. | 435/7 |
| 4,891,295 | 1/1990 | Kakimi | 430/138 |
| 4,902,599 | 2/1990 | Yamamoto et al. | 430/619 |
| 4,925,832 | 5/1990 | Hall et al. | 564/149 |
| 4,952,474 | 8/1990 | Tsukahara et al. | 430/138 |
| 4,970,132 | 11/1990 | Nakamura | 430/138 |
| 5,037,719 | 8/1991 | Nakamura | 430/138 |
| 5,070,132 | 12/1991 | Peccoux et al. | 524/492 |
| 5,185,231 | 2/1993 | Weigel | 430/203 |
| 5,196,288 | 3/1993 | Nakamura | 430/138 |
| 5,246,811 | 9/1993 | Higuchi | 430/138 |
| 5,258,281 | 11/1993 | Tanaka et al. | 430/619 |
| 5,384,238 | 1/1995 | Ellis et al. | 430/264 |

OTHER PUBLICATIONS

17029, *Research Disclosure*, Jun. 1978.
29963, *Research Disclosure*, Mar. 1989.

*Primary Examiner*—Thorl Chea
*Attorney, Agent, or Firm*—Gary L. Griswold; Walter N. Kirn; Gregory A. Evearitt

[57] ABSTRACT

Acrylonitrile compounds are useful as co-developers when used in combination with hindered phenol developers to produce high contrast black-and-white photothermographic and thermographic elements.

Acrylonitrile compounds are also useful as co-developers when used in combination with (i) hindered phenol developers, and (ii) trityl hydrazide and/or formyl-phenyl hydrazinc co-developers, to produce ultra-high contrast black-and-white photothermographic and thermographic elements.

The photothermographic and thermographic elements may be used as a photomask in a process where there is a subsequent exposure of an ultraviolet or short wavelength visible radiation-sensitive imageable medium.

36 Claims, No Drawings

ACRYLONITRILE COMPOUNDS AS CO-DEVELOPERS FOR BLACK-AND-WHITE PHOTOTHERMOGRAPHIC AND THERMOGRAPHIC ELEMENTS

BACKGROUND OF THE INVENTION

1. Field of Invention

Acrylonitrile compounds are useful as co-developers when used in combination with hindered phenol developers to produce high contrast black-and-white photothermographic and thermographic elements.

Acrylonitrile compounds are also useful as co-developers when used in combination with (i) hindered phenol developers, and (ii) trityl hydrazide and/or formyl-phenyl hydrazinc co-developers, to produce ultra-high contrast black-and-white photothermographic and thermographic elements.

2. Background of the Art

Silver halide-containing, photothermographic imaging materials (i.e., heat-developable photographic elements) which are developed with heat, without liquid development have been known in the art for many years. These materials are also known as "dry silver" compositions or emulsions and generally comprise a support having coated thereon: (a) a photosensitive compound that generates silver atoms when irradiated; (b) a relatively non-photosensitive, reducible silver source; (c) a reducing agent (i.e., a developer) for silver ion, for example for the silver ion in the non-photosensitive, reducible silver source; and (d) a binder.

The photosensitive compound is generally photographic silver halide which must be in catalytic proximity to the non-photosensitive, reducible silver source. Catalytic proximity requires an intimate physical association of these two materials so that when silver atoms (also known as silver specks, clusters, or nuclei) are generated by irradiation or light exposure of the photographic silver halide, those silver atoms are able to catalyze the reduction of the reducible silver source. It has long been understood that silver atoms ($Ag°$) are a catalyst for the reduction of silver ions, and that the photosensitive silver halide can be placed into catalytic proximity with the non-photosensitive, reducible silver source in a number of different fashions. The silver halide may be made "in situ," for example by adding a halogen-containing source to the reducible silver source to achieve partial metathesis (see, for example, U.S. Pat. No. 3,457,075); or by coprecipitation of silver halide and the reducible silver source material (see, for example, U.S. Pat. No. 3,839,049). The silver halide may also be made "ex situ" and added to the organic silver salt. The addition of silver halide grains to photothermographic materials is described in *Research Disclosure,* June 1978, Item No. 17029. It is also reported in the art that when silver halide is made ex situ, one has the possibility of controlling the composition and size of the grains much more precisely, so that one can impart more specific properties to the photothermographic element and can do so much more consistently than with the in situ technique.

The non-photosensitive, reducible silver source is a material that contains silver ions. Typically, the preferred non-photosensitive reducible silver source is a silver salt of a long chain aliphatic carboxylic acid having from 10 to 30 carbon atoms. The silver salt of behenic acid or mixtures of acids of similar molecular weight are generally used. Salts of other organic acids or other organic materials, such as silver imidazolates, have been proposed. U.S. Pat. No. 4,260,677 discloses the use of complexes of inorganic or organic silver salts as non-photosensitive, reducible silver sources.

In both photographic and photothermographic emulsions, exposure of the photographic silver halide to light produces small clusters of silver atoms ($Ag°$). The imagewise distribution of these clusters is known in the art as a latent image. This latent image is generally not visible by ordinary means. Thus, the photosensitive emulsion must be further developed to produce a visible image. This is accomplished by the reduction of silver ions which are in catalytic proximity to silver halide grains bearing the clusters of silver atoms (i.e., the latent image). This produces a black-and-white image. In photographic elements, the silver halide is reduced to form the black-and-white image. In photothermographic elements, the light-insensitive silver source is reduced to form the visible black-and-white image while much of the silver halide remains as silver halide and is not reduced.

In photothermographic elements the reducing agent for the organic silver salt, often referred to as a "developer," may be any material, preferably any organic material, that can reduce silver ion to metallic silver. At elevated temperatures, in the presence of the latent image, the silver ion of the non-photosensitive reducible silver source (e.g., silver behenate) is reduced by the reducing agent for silver ion. This produces a negative black-and-white image of elemental silver.

While conventional photographic developers such as methyl gallate, hydroquinone, substituted-hydroquinones, catechol, pyrogallol, ascorbic acid, and ascorbic acid derivatives are useful, they tend to result in very reactive photothermographic formulations and cause fog during preparation and coating of photothermographic elements. As a result, hindered phenol reducing agents have traditionally been preferred.

As the visible image in black-and-white photothermographic and thermographic elements is usually produced entirely by elemental silver ($Ag°$), one cannot readily decrease the amount of silver in the emulsion without reducing the maximum image density. However, reduction of the amount of silver is often desirable to reduce the cost of raw materials used in the emulsion and/or to enhance performance. For example, toning agents may be incorporated to improve the color of the silver image of the photothermographic elements as described in U.S. Pat. Nos. 3,846,136; 3,994,732; and 4,021,249.

Another method of increasing the maximum image density in photothermographic and thermographic emulsions without increasing the amount of silver in the emulsion layer is by incorporating dye-forming or dye-releasing materials in the emulsion. Upon imaging, the dye-forming or dye-releasing material is oxidized, and a dye and a reduced silver image are simultaneously formed in the exposed region. In this way, a dye-enhanced black-and-white silver image can be produced. Dye enhanced black-and-white silver image forming materials and processes are described in U.S. Pat. No. 5,185,231.

Thermographic imaging constructions (i.e., heat-developable materials) processed with heat, and without liquid development, are widely known in the imaging arts and rely on the use of heat to help produce an image. These elements generally comprise a support or substrate (such as paper, plastics, metals, glass, and the like) having coated thereon: (a) a thermally-sensitive, reducible silver source; (b) a reducing agent for the thermally-sensitive, reducible silver source (i.e., a developer); and (c) a binder.

In a typical thermographic construction, the image-forming layers are based on silver salts of long chain fatty acids. Typically, the preferred non-photosensitive reducible silver source is a silver salt of a long chain aliphatic carboxylic acid having from 10 to 30 carbon atoms. The silver salt of behenic acid or mixtures of acids of similar molecular weight are generally used. At elevated temperatures, silver behenate is reduced by a reducing agent for silver ion such as methyl gallate, hydroquinone, substituted-hydroquinones, hindered phenols, catechol, pyrogallol, ascorbic acid, ascorbic acid derivatives, and the like, whereby an image of elemental silver is formed.

Some thermographic constructions are imaged by contacting them with the thermal head of a thermographic recording apparatus, such as a thermal printer, thermal facsimile, and the like. In such instances, an anti-stick layer is coated on top of the imaging layer to prevent sticking of the thermographic construction to the thermal head of the apparatus utilized. The resulting thermographic construction is then heated to an elevated temperature, typically in the range of about 60°–225° C., resulting in the formation of an image.

The imaging arts have long recognized that the fields of photothermography and thermography are clearly distinct from that of photography. Photothermographic and thermographic elements differ significantly from conventional silver halide photographic elements which require wet-processing.

In photothermographic imaging elements, a visible image is created by heat as a result of the reaction of a developer incorporated within the element. Heat is essential for development and temperatures of over 100° C. are routinely required. In contrast, conventional wet-processed photographic imaging elements require processing in aqueous processing baths to provide a visible image (e.g., developing and fixing baths) and development is usually performed at a more moderate temperature (e.g., 30°–50° C.).

In photothermographic elements only a small amount of silver halide is used to capture light and a different source of silver (e.g., silver behenate) is used to generate the image. Thus, in photothermography the silver halide serves as a silver catalyst generator for the development of the non-photosensitive, reducible silver source. In contrast, conventional wet-processed black-and-white photographic elements use only one form of silver (e.g., silver halide) which, upon development, is itself convened to the silver image. Additionally, photothermographic elements require an amount of silver halide per unit area that is as little as one-hundredth of that used in conventional wet-processed silver halide.

Photothermographic systems employ a light-insensitive silver salt, such as silver behenate, which participates with the reducing agent in developing the latent image. In contrast, photographic systems do not employ a light-insensitive silver salt directly in the image-forming process. As a result, the image in photothermographic elements is produced primarily by reduction of the light-insensitive silver source (silver behenate) while the image in photographic black-and-white elements is produced primarily by the reduction of silver halide.

In photothermographic elements, all of the "chemistry" of the system is incorporated within the element itself. For example, photothermographic elements incorporate a developer (i.e., a reducing agent for the non-photosensitive reducible source of silver) within the element while conventional photographic elements do not. The incorporation of the developer into photothermographic elements can lead to increased formation of "fog" upon coating of photothermographic emulsions as compared to photographic emulsions. Even in so-called instant photography, developer chemistry is physically separated from the silver halide until development is desired. Much effort has gone into the preparation and manufacture of photothermographic elements to minimize formation of fog upon coating, storage, and post-processing aging.

Similarly, in photothermographic elements, the unexposed silver halide inherently remains after development and the element must be stabilized against further exposure and spontaneous development. In contrast, the silver halide is removed from photographic elements after development to prevent further imaging (i.e., the fixing step).

In photothermographic elements the binder is capable of wide variation and a number of binders are useful in preparing these elements. In contrast, photographic elements are limited almost exclusively to hydrophilic colloidal binders such as gelatin.

Because photothermographic elements require thermal processing, they pose different considerations and present distinctly different problems in manufacture and use. In addition, the effects of additives (e.g., stabilizers, antifoggants, speed enhancers, sensitizers, supersensitizers, etc.) which are intended to have a direct effect upon the imaging process can vary depending upon whether they have been incorporated in a photothermographic element or incorporated in a photographic element.

Distinctions between photothermographic and photographic elements are described in *Imaging Processes and Materials* (*Neblette's Eighth Edition*); J. Sturge et al. Ed; Van Nostrand Reinhold: New York, 1989; Chapter 9 and in *Unconventional Imaging Processes*; E. Brinckman et al, Ed; The Focal Press: London and New York: 1978; pp. 74–75.

Hydrazides have been used in conventional wet processed black-and-white and color photographic systems. They have found use as nucleating agents, infectious developers, contrast and speed improving agents, and color developing agents.

Hydrazides have been studied as infectious developers for use in photographic graphic arts films. See U.S. Pat. Nos. 4,798,790 and 4,925,832 and Kitchin, J. P. et al. *J. Photogr. Sci.* 1987, 35, 162–164 and Kitchin, J. P. et al. *J. Imag. Technol.* 1989, 15(6), 282–284.

The use of hydrazides with hydroquinone-type (e.g., polyhydroxy benzene) developers is known to produce photographic elements with very high contrast in wet silver halide photographic materials. These materials have been found to be very advantageous for graphic arts laser imaging applications.

U.S. Pat. Nos. 4,891,295; 4,902,599; 4,952,474; 4,970,132; 5,037,719; 5,070,132; 5,196,288; and 5,246,811 all refer to the use of formyl-phenyl hydrazines and/or their derivatives in combination with traditional wet silver halide-type developers; silver halide; a polymerizable compound, and a dye or color-forming compound (sometimes contained in microcapsules). Upon imaging and heat development of the light-sensitive material, the hydrazide initiates polymerization within the area where the latent image has been formed. Pressure is then applied to transfer the dye image from the unpolymerized capsules to a receiving sheet. Silver soaps are optionally included and incorporation of the polymerization and dyeforming materials into microcapsules is preferred. In these systems, the hydrazide is an initiator for the polymerization while the developer develops the silver halide.

U.S. Pat. No. 4,735,884 uses trityl hydrazides in a gelatin-based construction as a reducing agent for silver halide as well as an initiator for the polymerization of acrylates within the area where the latent image has been formed. The hydrazides are encapsulated with other traditional silver halide developers, the photosensitive silver halide and leuco dyes or pre-formed dyes. After exposure, heat is applied to accelerate the crosslinking reactions, pressure is applied to break the non-exposed capsules, and the positive color image is transferred to a receiving layer.

U.S. Pat. No. 4,772,531 combines a sulfonamidophenol developing agent moiety and a trityl hydrazide group in one molecule to minimize the need for an additional developer within the polymerization system.

U.S. Pat. No. 3,667,958 uses a combination of a polyhydroxybenzene reducing agent (i.e., a hydroquinone-type developer) with a hydroxylamine, reductone and/or a hydrazine reducing agent in photothermographic constructions to produce black-and-white images. A preferred hydrazine is 1-formyl-2-phenyl hydrazine.

U.S. patent application Ser. No. 08/369,730 (filed Jan. 6, 1995) discloses hydrazide compounds useful as co-developers for black-and-white photo-thermographic elements. These elements contain (i) a hindered phenol developer, and (ii) a trityl hydrazide or a formyl phenylhydrazine co-developer, and provide elements having high Dmax (>5.00), fast photospeeds, and high contrast (>20.0). Improving the reactivity of these compounds by the addition of a contrast-promoting agent or an additional co-developer would allow the reduction in the amount of silver by lowering the silver coating weights, reduce the amount of hydrazine or hydrazide co-developer needed to achieve high contrast, lower costs, and improve the reactivity of less effective compounds.

It would be especially desirable to be able to achieve in dry photothermographic or thermographic elements the high contrast that is currently available in wet silver halide materials. New developing agent systems for use in photothermographic and thermographic elements are therefore desired.

SUMMARY OF THE INVENTION

The present invention, shows that a reducing agent system (i.e., a developer system) comprising: (i) at least one hindered phenol developer; and (ii) at least one acrylonitrile compound co-developer provides black-and-white photothermographic and thermographic elements having high contrast and high image density (Dmax).

The photothermographic elements of the present invention comprise a support bearing at least one photosensitive, image-forming, photothermographic emulsion layer comprising:

(a) a photosensitive silver halide;

(b) a non-photosensitive, reducible silver source;

(c) a reducing agent system for the non-photosensitive, reducible silver source; and (d) a binder.

wherein the reducing agent system comprises:

(i) at least one hindered phenol developer;

(ii) at least one co-developer of the formula:

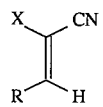

wherein:

R represents halogen (e.g., bromine, chlorine, iodine), hydroxy, thiohydrocarbyl (that is any compound having the connecting group —S—C— group, such as thioalkyl, thioaryl, thiol, thioalkenyl, thioacyl, etc.), oxyhydrocarbyl (that is any compound having the connecting group —O—C—, such as alkoxy, aryloxy (e.g., phenoxy), acyloxy, alkenyloxy,, etc.), metal salts of hydroxy (e.g., $O^-M^+$, wherein $M^+$ is a metal cation (preferably monovalent, although divalent and trivalent may be used) such as $Li^+$, $K^+$, $Fe^{+2}$, $Ag^+$, etc.) and any chemical moiety (organic or not) connected through an oxygen or sulfur (ion or atom) such as —$OSO_2R'$ (e.g., as where R' is $CF_3$, etc.); and X represents an electron withdrawing group.

In another embodiment, the present invention provides photothermographic elements comprising a support bearing at least one photosensitive, image-forming, photothermographic emulsion layer comprising:

(a) a photosensitive silver halide;

(b) a non-photosensitive, reducible silver source;

(c) a reducing agent system for the non-photosensitive, reducible silver source; and (d) a binder.

wherein the reducing agent system comprises:

(i) at least one hindered phenol developer;

(ii) at least one acrylonitrile compound of the formula:

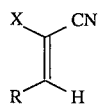

wherein; R and X are as defined above, and (iii) at least one co-developer of the formula:

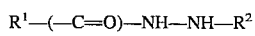

wherein:

$R^1$ represents hydrogen and $R^2$ represents an aryl group; or $R^1$ represents hydrogen, alkyl or alkenyl groups of 1 to 20 carbon atoms, preferably alkyl or alkenyl groups of 1 to 10 carbon atoms, and more preferably of 1 to 5 carbon atoms; alkoxy, alkylthio, or amido groups of 1 to 20 carbon atoms, preferably of 1 to 10 carbon atoms, and more preferably of 1 to 5 carbon atoms; aryl, alkaryl, or aralkyl groups comprising up to 20 carbon atoms, preferably of up to 10 carbon atoms, and more preferably up to 6 carbon atoms; aryloxy, arylthio, or anilino groups of up to 20 carbon atoms, preferably of up to 10 carbon atoms, and more preferably of up to 6 carbon atoms; aliphatic or aromatic heterocyclic ring groups containing up to 6 ring atoms; carbocyclic ring groups comprising up to 6 ring carbon atoms; or fused ring or bridging groups comprising up to 14 ring atoms; and $R^2$ represents a trityl group.

When $R^2$ represents a trityl group, the compounds are referred to herein as trityl hydrazides. The phrase "trityl group" is often used to refer to the triphenylmethyl group (Ph$_3$C—). As used herein, the phrase "trityl group" is broadened to include triarylmethyl (i.e., Ar$_3$C—), triphenylmethyl and substituted-triphenylmethyl as well as triphenylmethyl type groups wherein two of the phenyl groups are joined (for example, as in compound H-27 disclosed later herein).

When R$^1$ represents H and R$^2$ represents aryl or substituted aryl, the compounds are referred to herein as "formylphenyl hydrazines" or "formyl-aryl hydrazines."

The present invention provides heat-developable, photothermographic and thermographic elements which are capable of providing high photospeeds, stable, high density images with high resolution, good sharpness, high contrast, and good shelf stability. The possibility of low absorbance at 350–450 nm facilitates the use of the elements of this invention in graphic arts applications such as contact printing, proofing, and duplicating ("duping").

When the photothermographic element used in this invention is heat developed, preferably at a temperature of from about 80° C. to about 250° C. (176° F. to 482° F.) for a duration of from about 1 second to about 2 minutes, in a substantially water-free condition after, or simultaneously with, imagewise exposure, a black-and-white silver image is obtained.

In photothermographic elements of the present invention, the layer(s) that contain the photosensitive silver halide and non-photosensitive, reducible silver source are referred to herein as emulsion layer(s). According to the present invention, one or more components of the reducing agent system is added either to the emulsion layer(s) or to a layer or layers adjacent to the emulsion layer(s). Layers that are adjacent to the emulsion layer(s) may be, for example, protective topcoat layers, primer layers, interlayers, opacifying layers, antistatic layers, antihalation layers, barrier layers, auxiliary layers, etc. It is preferred that the reducing agent system be present in the photothermographic emulsion layer or topcoat layer.

The present invention also provides a process for the formation of a visible image by first exposing to electromagnetic radiation and thereafter heating the inventive photothermographic element.

The present invention also provides a process comprising the steps of:

(a) exposing the inventive photothermographic element on a support transparent to ultraviolet radiation or short wavelength visible radiation, to electromagnetic radiation to which the photosensitive silver halide of the element is sensitive, to generate a latent image;

(b) heating the exposed element to develop the latent image into a visible image;

(c) positioning the element with a visible image thereon between a source of ultraviolet or short wavelength visible radiation energy and an ultraviolet or short wavelength radiation photosensitive imageable medium; and (d) thereafter exposing the imageable medium to ultraviolet or short wavelength visible radiation through the visible image on the element, thereby absorbing ultraviolet or short wavelength visible radiation in the areas of the element where there is a visible image and transmitting ultraviolet or short wavelength visible radiation through areas of the element where there is no visible image.

The photothermographic element may be exposed in step (a) with visible, infrared, or laser radiation.

The heat-developable, thermographic elements of the present invention comprise a support having coated thereon:

(a) a non-photosensitive, reducible silver source;

(b) a reducing agent system for the non-photosensitive, reducible silver source; and (c) a binder;

wherein the reducing agent system comprises:

(i) at least one hindered phenol developer;

(ii) at least one co-developer of the formula:

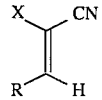

wherein R and X are as defined above.

In another embodiment, the heat-developable, thermographic elements of the present invention comprise a support having coated thereon:

(a) a non-photosensitive, reducible silver source;

(b) a reducing agent system for the non-photosensitive, reducible silver source; and (c) a binder;

wherein the reducing agent system comprises:

(i) at least one hindered phenol developer;

(ii) at least one acrylonitrile compound of the formula:

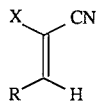

wherein R and X are as defined above.

(iii) at least one co-developer of the formula:

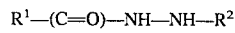

R$^1$—(C=O)—NH—NH—R$^2$ wherein R$^1$ and R$^2$ are as defined above.

In thermographic elements of the present invention, the layer(s) that contain the non-photosensitive reducible silver source are referred to herein as thermographic layer(s) or thermographic emulsion layer(s). When used in thermographic elements according to the present invention, one or more components of the reducing agent system is added either to the thermographic emulsion layer(s) or to a layer or layers adjacent to the emulsion layer(s). Layers that are adjacent to the emulsion layer(s) may be, for example, protective topcoat layers, primer layers, antistatic layers, interlayers, opacifying layers, barrier layers, auxiliary layers, etc. It is preferred that the reducing agent system be present in the thermographic layer or topcoat layer.

When the thermographic element used in this invention is heat developed, preferably at a temperature of from about 80° C. to about 250° C. (176° F. to 482° F.) for a duration of from about 1 second to about 2 minutes in a substantially water-free condition, a black-and-white silver image is obtained.

The present invention also provides a process for the formation of a visible image by heating the inventive thermographic element described earlier herein.

The present invention further provides a process comprising the steps of:

(a) heating the inventive thermographic element on a support transparent to ultraviolet radiation or short wavelength visible radiation at a temperature sufficient to generate a visible image thereon;

(b) positioning the thermographic element with a visible image thereon between a source of ultraviolet or short wavelength visible radiation and an ultraviolet or short wavelength visible radiation photo-sensitive imageable medium; and (c) thereafter exposing the imageable medium to ultraviolet or short wavelength visible radiation through the visible image on the element, thereby absorbing ultraviolet or short wavelength visible radiation in the areas of the element where there is a visible image and transmitting ultraviolet or short wavelength visible radiation through areas of the element where there is no visible image.

The reducing agent system (i.e., combination of developers and co-developers) used in this invention provide a significant improvement in image contrast when compared to photothermographic and thermographic elements incorporating known developers or known developer combinations.

The photothermographic and thermographic elements of this invention may be used to prepare black-and-white images. The photothermographic material of this invention can be used, for example, in conventional black-and-white photothermography, in electronically generated black-and-white hardcopy recording, in the graphic arts area (e.g., phototypesetting), in digital proofing, and in digital radiographic imaging. The material of this invention provides high photospeeds, provides strongly absorbing black-and-white images, and provides a dry and rapid process.

Heating in a substantially water-free condition as used herein, means heating at a temperature of 80° to 250° C. The term "substantially water-free condition" means that the reaction system is approximately in equilibrium with water in the air, and water for inducing or promoting the reaction is not particularly or positively supplied from the exterior to the element. Such a condition is described in T. H. James, *The Theory of the Photographic Process*, Fourth Edition, Macmillan 1977, page 374.

As used herein:

"aryl" preferably represents phenyl or naphthyl.

"photothermographic element" means a construction comprising at least one photothermographic emulsion layer and any supports, topcoat layers, image receiving layers, blocking layers, antihalation layers, subbing or priming layers, etc.

"thermographic element" means a construction comprising at least one thermographic emulsion layer and any supports, topcoat layers, image receiving layers, blocking layers, antihalation layers, subbing or priming layers, etc.

"emulsion layer" means a layer of a photothermographic element that contains the photosensitive silver halide and non-photosensitive reducible silver source material; or a layer of the thermographic element that contains the non-photosensitive reducible silver source material.

"ultraviolet region of the spectrum" means that region of the spectrum less than or equal to about 400 nm, preferably from about 100 nm to about 400 nm. More preferably, the ultraviolet region of the spectrum is the region between about 190 nm and about 400 nm;

"short wavelength visible region of the spectrum" means that region of the spectrum from about 400 nm to about 450 nm; and "infrared region of the spectrum" means from about 750 nm to about 1400 nm; "visible region of the spectrum" means from about 400 nm to about 750 nm; and "red region of the spectrum" means from about 640 nm to about 750 nm. Preferably the red region of the spectrum is from about 650 nm to about 700 nm.

$R$, $R^1$, $R^2$, and $X$ in the foregoing-disclosed formulae may contain additional substituent groups. As is well understood in this area, substitution is not only tolerated, but is often advisable and substitution is anticipated on the compounds used in the present invention. As a means of simplifying the discussion and recitation of certain substituent groups, the terms "group" and "moiety" are used to differentiate between those chemical species that may be substituted and those which may not be so substituted. Thus, when the term "group," such as "aryl group," is used to describe a substituent, that substituent includes the use of additional substituents beyond the literal definition of the basic group. Where the term "moiety" is used to describe a substituent, only the unsubstituted group is intended to be included. For example, the phrase, "alkyl group" is intended to include not only pure hydrocarbon alkyl chains, such as methyl, ethyl, propyl, t-butyl, cyclohexyl, iso-octyl, octadecyl and the like, but also alkyl chains bearing substituents known in the art, such as hydroxyl, alkoxy, phenyl, halogen atoms (F, Cl, Br, and I), cyano, nitro, amino, carboxy, etc. For example, alkyl group includes ether groups (e.g., $CH_3$—$CH_2$—$CH_2$—O—$CH_2$—), haloalkyls, nitroalkyls, carboxyalkyls, hydroxyalkyls, sulfoalkyls, etc. On the other hand, the phrase "alkyl moiety" is limited to the inclusion of only pure hydrocarbon alkyl chains, such as methyl, ethyl, propyl, t-butyl, cyclohexyl, iso-octyl, octadecyl, and the like. Substituents that react with active ingredients, such as very strongly electrophilic or oxidizing substituents, would of course be excluded by the ordinarily skilled artisan as not being inert or harmless.

Other aspects, advantages, and benefits of the present invention are apparent from the detailed description, examples, and claims.

DETAILED DESCRIPTION OF THE INVENTION

In photothermographic elements there exists the desire for products which exhibit increased contrast upon exposure to light and subsequent development. This desire is based upon the realization that contrast is directly related to the appearance of sharpness. Thus, products which exhibit increased contrast give the visual impression of enhanced sharpness.

Traditionally contrast has been defined by two methods, both of which are derived from the D-Log E curve. The first method is the determination of gamma, γ, which is defined as the slope of the straight-line section of the D-log E curve between two specified densities. The second is the determination of the overall sharpness of the toe section of the D-log E curve. By sharpness of the toe section, it is usually meant the relative change in density with exposure in the toe section of the traditional D-Log E curve. For instance, a sharp toe corresponds to a very rapid rise in density (at low levels of density) with exposure, whereas a soft toe corresponds to a very gradual rise in density (at low levels of density) with exposure. If either the value of), is high or the toe is sharp, then the image has a relatively high contrast. If the value oft is low, or the toe is soft, the image has a relatively low contrast. Contrast must be also be maintained throughout the exposure range. Thus, high T at densities between about 2.0 and Dmax is also required to achieve sharp images.

The contrast must be optimized for each particular use. For some uses, certain parts of the sensitometric curve must be modified to increase or decrease the contrast of the product.

Photothermographic and thermographic systems have not found widespread use as replacement for wet silver halide in imaging systems because of slow speed, low Dmax, poor contrast, and insufficient sharpness at high Dmax. European Laid Open Patent Application No. 0 627 660 and U.S. Pat. No. 5,434,043 describe most of the characteristics and attributes of a photothermographic element having, for example, an antihalation system, silver halide grains having an average particle size of less than 0.10 μm, and infrared supersensitization leading to an infrared photothermographic article meeting the requirements for medical or graphic arts laser recording applications.

Conventional photothermographic elements comprising only bisphenol developers rarely exhibit a γ greater than about 3.0. These materials are well suited to medical imaging and similar uses where continuous tone reproduction is required but are not adequate for graphic arts uses where a much higher γ (e.g., >5.0) is necessary.

The shape of the sensitometric D-Log E curve for photothermographic elements of this invention incorporating acrylonitrile compounds as co-developers is similar to that observed for infectious development curves in hard dot black-and-white conventionally processed wet silver halide image-setting films. This allows the preparation of improved hard dot dry silver masks of high image quality useful for the production of plates in image-setting applications, contact proofs, and duplicating films also useful in the graphic arts. These masks are presently produced from conventional wet silver halide materials.

The Reducing Agent System for the Non-Photosensitive Reducible Silver Source In the black-and-white photothermographic and thermographic elements of the present invention, the reducing agent system (i.e., the developer system) for the organic silver salt comprises at least one hindered phenol compound; at least one co-developer of the formula:

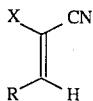

wherein P, and X are as defined above; and optionally at least one co-developer of the formula:

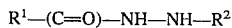

wherein $R^1$ and $R^2$ are as defined above.

Hindered phenol developers are compounds that contain only one hydroxy group on a given phenyl ring and have at least one additional substituent located ortho to the hydroxy group. They differ from traditional photographic developers which contain two hydroxy groups on the same phenyl ring (such as is found in hydroquinones). Hindered phenol developers may contain more than one hydroxy group as long as each hydroxy group is located on different phenyl rings. Hindered phenol developers include, for example, binaphthols (i.e., dihydroxybinaphthyls), biphenols (i.e., dihydroxybiphenyls), bis(hydroxynaphthyl)methanes, bis(hydroxyphenyl)methanes, and hindered phenols and hindered naphthols.

Non-limiting representative binaphthols include 1,1'-bi-2-naphthol; 1,1'-bi-4-methyl-2-naphthol; and 6,6'-dibromo-bi-2-naphthol. For additional compounds see U.S. Pat. No. 5,262,295 at column 6, lines 12–13, incorporated herein by reference.

Non-limiting representative biphenols include 2,2'-dihydroxy-3,3'-di-t-butyl-5,5-dimethylbiphenyl; 2,2'-dihydroxy-3,3',5,5'-tetra-t-butylbiphenyl; 2,2'-dihydroxy-3,3'-di-t-butyl-5,5'-dichlorobiphenyl; 2-(2-hydroxy-3-t-butyl-5-methylphenyl)-4-methyl-6-n-hexylphenol; 4,4'-dihydroxy-3,3',5,5'-tetra-t-butyl-biphenyl; and 4,4'-dihydroxy-3,3',5,5'-tetramethylbiphenyl. For additional compounds see U.S. Pat. No. 5,262,295 at column 4, lines 17–47, incorporated herein by reference.

Non-limiting representative bis(hydroxynaphthyl)methanes include 4,4'-methylenebis(2-methyl-1-naphthol). For additional compounds see U.S. Pat. No. 5,262,295 at column 6, lines 14–16, incorporated herein by reference.

Non-limiting representative bis(hydroxyphenyl)methanes include bis(2-hydroxy-3-t-butyl-5-methylphenyl)methane (CAO-5); 1,1-bis(2-hydroxy-3,5-dimethylphenyl)-3,5,5-trimethylhexane (Permanax™); 1,1-bis(3,5-di-t-butyl-4-hydroxyphenyl)methane; 2,2-bis(4-hydroxy-3-methylphenyl)propane; 4,4-ethylidene-bis(2-t-butyl-6-methylphenol); and 2,2-bis(3,5-dimethyl-4-hydroxyphenyl)propane. For additional compounds see U.S. Pat. No. 5,262,295 at column 5, line 63, to column 6, line 8, incorporated herein by reference.

Non-limiting representative hindered phenols include 2,6-di-t-butylphenol; 2,6-di-t-butyl-4-methylphenol; 2,4-di-t-butylphenol; 2,6-dichlorophenol; 2,6-dimethylphenol; and 2-t-butyl-6-methylphenol.

Non-limiting representative hindered naphthols include 1-naphthol; 4-methyl-1-naphthol; 4-methoxy-1-naphthol; 4-chloro-1-naphthol; and 2-methyl-1-naphthol. For additional compounds see U.S. Pat. No. 5,262,295 at column 6, lines 17–20, incorporated herein by reference.

The co-developer may be a acrylonitrile compound or a mixture of acrylonitrile compounds.

In order to function effectively in the photothermographic and thermographic elements of this invention, the acrylonitrile compounds are required to have an electron withdrawing group, X, attached to the same carbon atom as the nitrile group. The acrylonitrile compounds are also required to have a group R attached at the position noted in the formulae.

As noted above, X is an electron withdrawing group. As used herein, the electron withdrawing nature of X is determined by its "Hammet $\sigma_p$ value." The Hammett $\sigma_p$ constant is defined by the Hammett Equation log $K/K° = \sigma_p \rho$ where $K°$ is the acid dissociation constant of the reference in aqueous solution at 25° C., K is the corresponding constant for the para-substituted acid, and ρ is defined as 1.0 for the dissociation of para-substituted benzoic acids. A positive Hammett sigma (σ) indicates the group is electron withdrawing. Phenyl, although being found in references to have a Hammett sigma value of −0.01 or 0 should also be acceptable.

Preferred electron withdrawing groups are those having a Hammett $\sigma_p$ value greater than about 0.20 preferably greater than about 0.35. Non limiting examples of electron withdrawing groups X, include cyano, halogen, formyl, alkoxycarbonyl, metaloxycarbonyl, hydroxycarbonyl, nitro, acetyl, perfluoroalkyl, alkylsulfonyl, arylsulfonyl as well as other groups listed in Lange's *Handbook of Chemistry*, 14th Edition, McGraw-Hill, 1992; Chapter 9, pp 2–7.

R may be halogen (e.g., bromo, chloro, iodo), hydroxy, thiohydrocarbyl (that is any compound having the connecting group —S—C— group, such as thioalkyl, thioaryl, thiol, thioalkenyl, thioacyl, etc.), oxyhydrocarbyl (that is any compound having the connecting group —O—C—, such as alkoxy, aryloxy (e.g., phenoxy), acyloxy, alkenyloxy,, etc.), metal salts of hydroxy (e.g., $OM^+$, wherein $M^+$ is a metal cation (preferably monovalent, although divalent and trivalent may be used) such as $Li^+$, $K^+$, $Fe^{+2}$, $Ag^+$, etc.) and any chemical moiety (organic or not) connected through an oxygen or sulfur (ion or atom) such as —$OSO_2R'$ (e.g., as where R' is $CF_3$, etc.)."

Acrylonitrile compounds may be prepared as described later herein.

Representative acylonitrile co-developer compounds useful in the present invention are shown below. These representations are exemplary and are not intended to be limiting.

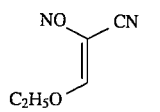

CN-01

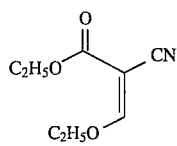

CN-02

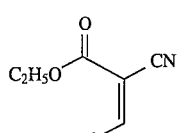

CN-03

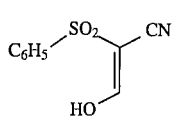

CN-04

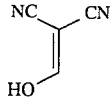

CN-05

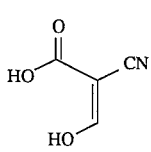

CN-06

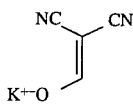

CN-07

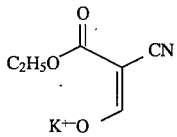

CN-08

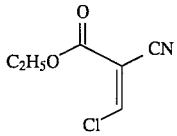

CN-09

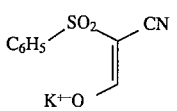

CN-10

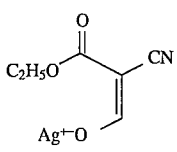

CN-11

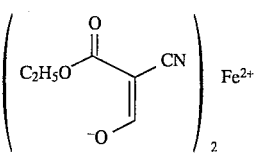

CN-12

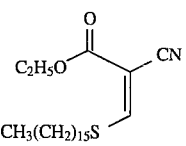

CN-13

In the reducing agent system, the hindered phenol developer should be present at from 1 to 15% by weight of the imaging layer. The acrylonitrile compound co-developer should be present at from 0.01 to 1.5% by weight of the imaging layer.

The amounts of the above described reducing agents of the reducing agent system that are added to the photothermographic or thermographic element of the present invention may be varied depending upon the particular compound used, upon the type of emulsion layer, and whether components of the reducing agent system are located in the emulsion layer or a topcoat layer. However, when present in the emulsion layer, the hindered phenol should be present in an amount of from 0.01 to 50 mole, preferably from 0.05 to 25 mole; the acrylonitrile compound should be present in an amount of from 0.0005 to 25 mole, preferably from 0.0025 to 10 mole—per mole of the silver halide.

In multilayer constructions, if one of the developers of the reducing agent system is added to a layer other than the emulsion layer, slightly higher proportions may be necessary and the hindered phenol should be present at from 2 to 20% by weight; the substituted acrylonitrile co-developer when used should be present at from 0.2 to 20% by weight; of the layer in which it is present.

As noted above, a trityl hydrazide, a mixture of trityl hydrazides, a formyl-phenyl hydrazine, a mixture of formyl-phenyl hydrazines, or a mixture of at least one trityl hydrazide and at least one formyl-phenyl hydrazine may also be used in combination with the hindered phenol and acrylonitrile co-developer.

Trityl hydrazides may be prepared by the reaction at room temperature of a stirred solution of a hydrazide and a slight molar excess of triethylamine dissolved in acetonitrile with an appropriately substituted trityl chloride (chlorotriphenylmethane). The trityl chloride is added gradually over a period of about 5 minutes. The mixture is warmed to 40° C. for approximately 1 hour. The mixture is poured into water and the resulting precipitate is filtered. In most cases, recrystallization of the solid from ethyl alcohol is appropriate.

Formyl-phenyl hydrazines may be prepared by the addition of an appropriately substituted phenyl hydrazine at 0° C. to a solution of formamide in acetic acid. After stirring for several hours at room temperature, the mixture is poured into water and the resulting precipitate is filtered. In most cases, recrystallization of the solid from ethyl alcohol is appropriate.

Representative trityl hydrazide and formyl-phenyl hydrazine co-developer compounds useful in the present invention are shown below. Preparation for these compounds are described later herein. These representations are exemplary and are not intended to be limiting.

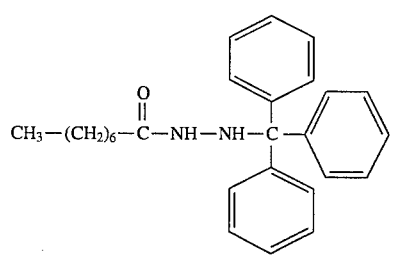
H-1
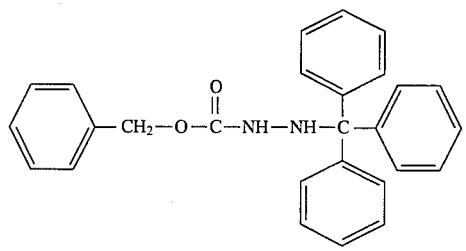
H-2
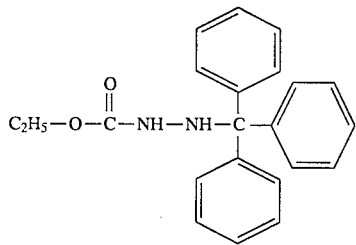
H-3
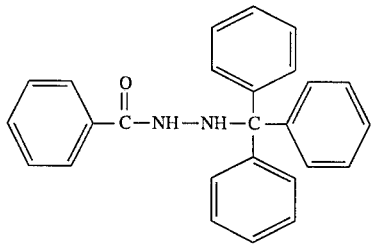
H-4
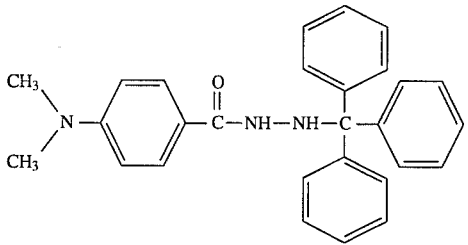
H-5
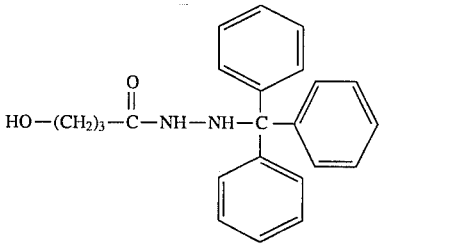
H-6

-continued
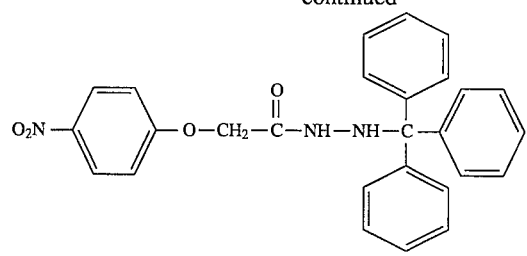
H-7
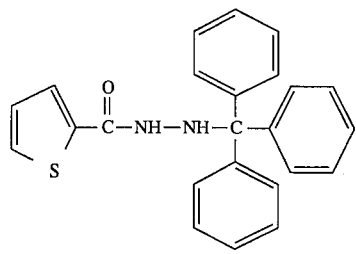
H-8
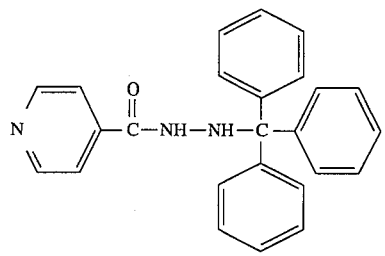
H-9
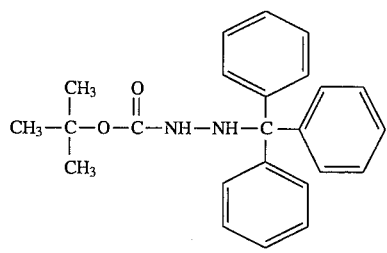
H-10
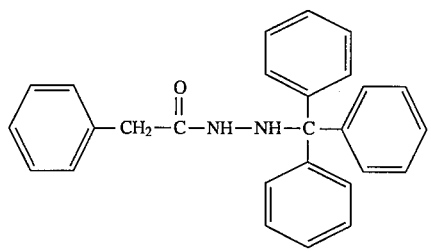
H-11
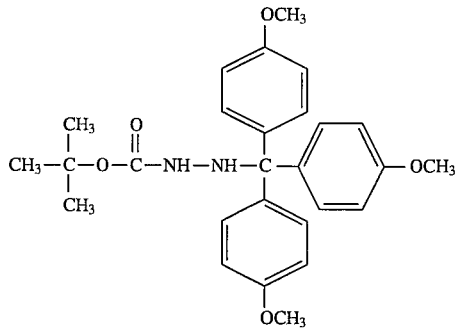
H-12

-continued
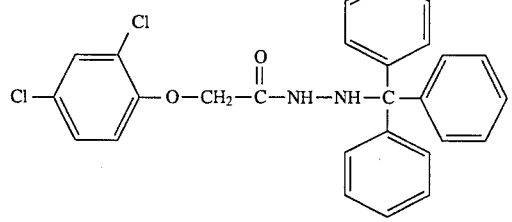
H-13
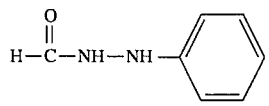
H-14
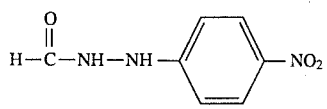
H-15
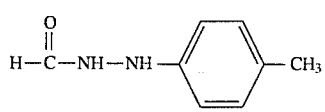
H-16
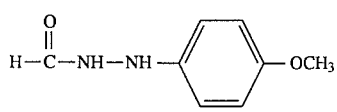
H-17
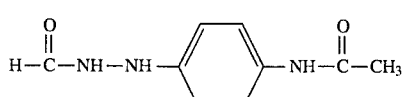
H-18
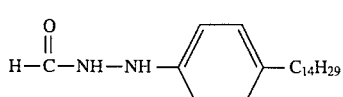
H-19
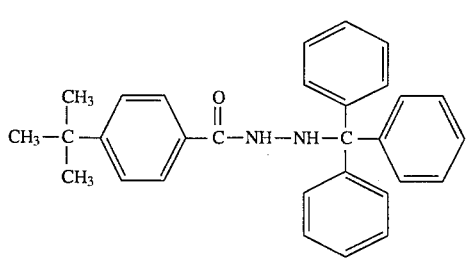
H-20
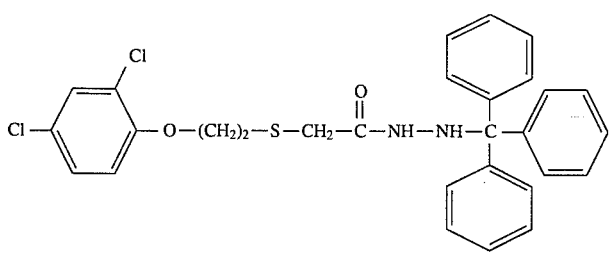
H-21
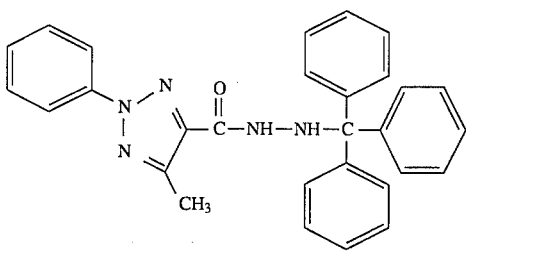
H-22

-continued
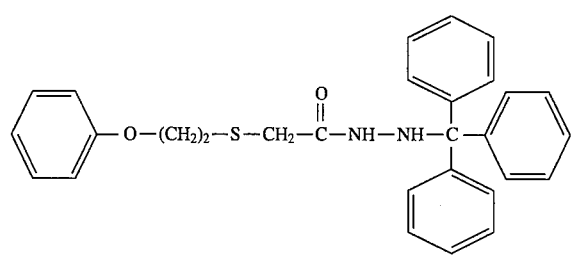
H-23
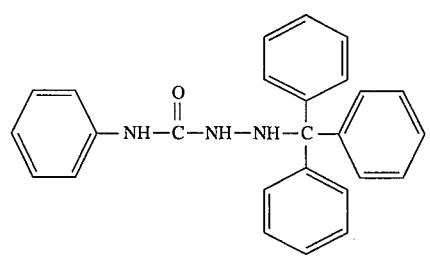
H-24
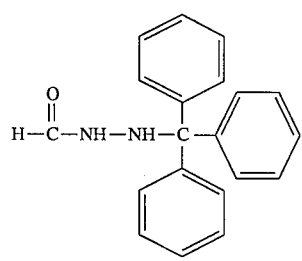
H-25
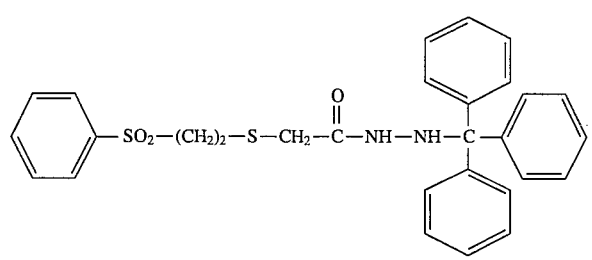
H-26
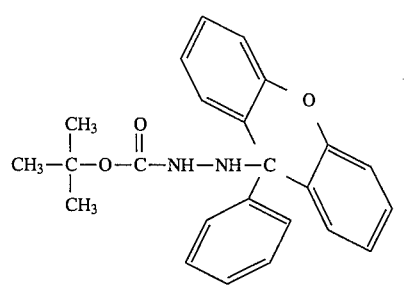
H-27
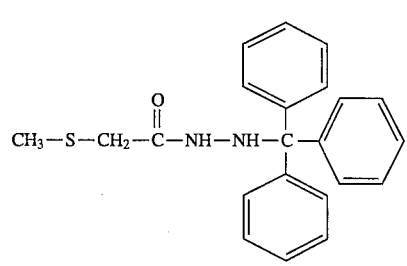
H-28

-continued

H-29

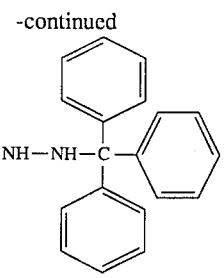

As noted above, a trityl hydrazide, a mixture of trityl hydrazides, a formyl-phenyl hydrazine, a mixture of formyl-phenyl hydrazines, or a mixture of at least one trityl hydrazide and at least one formyl-phenyl hydrazine may also be used in combination with the hindered phenol and acrylonitrile co-developer.

When at least one trityl hydrazide or formyl-phenyl hydrazine compound is used in combination with the hindered phenol developer and acrylonitrile co-developer is used in the reducing agent system, the hindered phenol developer should be present at from 1 to 15% by weight of the imaging layer; the acrylonitrile compound co-developer should be present at from 0.005 to 15% by weight of the imaging layer; the trityl hydrazide should be present at from 0.10 to 15% by weight of the imaging layer; and the formyl-phenyl hydrazine should be present at from 0.005 to 0.15% by weight of the imaging layer of the imaging layer.

The amounts of the above described reducing agents of the reducing agent system that are added to the photothermographic or thermographic element of the present invention may be varied depending upon the particular compound used, upon the type of emulsion layer, and whether components of the reducing agent system are located in the emulsion layer or a topcoat layer. However, when present in the emulsion layer, the hindered phenol should be present in an amount of from 0.01 to 50 mole, preferably from 0.05 to 25 mole; the acrylonitrile compound should be present in an amount of from 0.0001 to 25 mole, preferably from 0.0005 to 10 mole; the trityl hydrazide should be present in an amount of from 0.0005 to 50 mole, preferably from 0.0025 to 25 mole; and the formyl-phenyl hydrazine should be present in an amount of from 0.0001 to 1.0 mole, preferably from 0.0005 to 0.5 mole—per mole of the silver halide.

In multilayer constructions, if one of the developers of the reducing agent system is added to a layer other than the emulsion layer, slightly higher proportions may be necessary and the hindered phenol should be present at from 2 to 20% by weight; the substituted acrylonitrile co-developer when used should be present at from 0.01 to 20% by weight; the trityl hydrazide should be present at from 0.20 to 20% by weight; and the formyl-phenyl hydrazine should be present at from 0.01 to 0.20% by weight—of the layer in which it is present.

Photothermographic elements of the invention may also contain other additives such as shelf-life stabilizers, toners, development accelerators, acutance dyes, post-processing stabilizers or stabilizer precursors, and other image-modifying agents.

The Photosensitive Silver Halide

As noted above, when used in a photothermographic element, the present invention includes a photosensitive silver halide. The photosensitive silver halide can be any photosensitive silver halide, such as silver bromide, silver iodide, silver chloride, silver bromoiodide, silver chlorobromoiodide, silver chlorobromide, etc. The photosensitive silver halide can be added to the emulsion layer in any fashion so long as it is placed in catalytic proximity to the light-insensitive reducible silver compound which serves as a source of reducible silver.

The silver halide may be in any form which is photosensitive including, but not limited to cubic, octahedral, rhombic dodecahedral, orthorhombic, tetrahedral, other polyhedral habits, etc., and may have epitaxial growth of crystals thereon.

The silver halide grains may have a uniform ratio of halide throughout; they may have a graded halide content, with a continuously varying ratio of, for example, silver bromide and silver iodide; or they may be of the core-shell-type, having a discrete core of one halide ratio, and a discrete shell of another halide ratio. Core-shell silver halide grains useful in photothermographic elements and methods of preparing these materials are described in U.S. Pat. No. 5,382,504. A core-shell silver halide grain having an iridium doped core is particularly preferred. Iridium doped core-shell grains of this type are described in U.S. Pat. No. 5,434,043.

The silver halide may be prepared ex situ, (i.e., be pre-formed) and mixed with the organic silver salt in a binder prior to use to prepare a coating solution. The silver halide may be pre-formed by any means, e.g., in accordance with U.S. Pat. No. 3,839,049. For example, it is effective to blend the silver halide and organic silver salt using a homogenizer for a long period of time. Materials of this type are often referred to as "pre-formed emulsions." Methods of preparing these silver halide and organic silver salts and manners of blending them are described in Research Disclosure, June 1978, item 17029; U.S. Pat. Nos. 3,700,458 and 4,076,539; and Japanese Patent Application Nos. 13224/74, 42529/76, and 17216/75.

It is desirable in the practice of this invention to use pre-formed silver halide grains of less than 0.10 μm in an infrared sensitized, photothermographic material. It is also preferred to use iridium doped silver halide grains and iridium doped core-shell silver halide grains as disclosed in European Laid Open Patent Application No 0 627 660 and U.S. Pat. No. 5,434,043 described above.

Pre-formed silver halide emulsions when used in the material of this invention can be unwashed or washed to remove soluble salts. In the latter case, the soluble salts can be removed by chill-setting and leaching or the emulsion can be coagulation washed, e.g., by the procedures described in U.S. Pat. Nos. 2,618,556; 2,614,928; 2,565,418; 3,241,969; and 2,489,341.

It is also effective to use an in situ process, i.e., a process in which a halogen-containing compound is added to an organic silver salt to partially convert the silver of the organic silver salt to silver halide.

The light-sensitive silver halide used in the present invention can be employed in a range of about 0.005 mole to about 0.5 mole; preferably, from about 0.01 mole to about 0.15 mole per mole; and more preferably, from 0.03 mole to 0.12 mole of silver halide per mole of non-photosensitive reducible silver salt.

The silver halide used in the present invention may be chemically and spectrally sensitized in a manner similar to that used to sensitize conventional wet-processed silver halide or state-of-the-art heat-developable photographic materials.

For example, it may be chemically sensitized with a chemical sensitizing agent, such as a compound containing sulfur, selenium, tellurium, etc., or a compound containing gold, platinum, palladium, ruthenium, rhodium, iridium, or combinations thereof, etc., a reducing agent such as a tin halide, etc., or a combination thereof. The details of these procedures are described in T. H. James, *The Theory of the Photographic Process*, Fourth Edition, Chapter 5, pp. 149 to 169. Suitable chemical sensitization procedures are also disclosed in Shepard, U.S. Pat. No. 1,623,499; Waller, U.S. Pat. No. 2,399,083; McVeigh, U.S. Pat. No. 3,297,447; and Dunn, U.S. Pat. No. 3,297,446.

Addition of sensitizing dyes to the photosensitive silver halides serves to provide them with high sensitivity to visible and infrared light by spectral sensitization. Thus, the photosensitive silver halides may be spectrally sensitized with various known dyes that spectrally sensitize silver halide. Non-limiting examples of sensitizing dyes that can be employed include cyanine dyes, merocyanine dyes, complex cyanine dyes, complex merocyanine dyes, holopolar cyanine dyes, hemicyanine dyes, styryl dyes, and hemioxanol dyes. Of these dyes, cyanine dyes, merocyanine dyes, and complex merocyanine dyes are particularly useful.

An appropriate amount of sensitizing dye added is generally about $10^{-10}$ to $10^{-1}$ mole; and preferably, about $10^{-8}$ to $10^{-3}$ moles of dye per mole of silver halide.

Supersensitizers

To get the speed of the photothermographic elements up to maximum levels and further enhance sensitivity, it is often desirable to use supersensitizers. Any supersensitizer can be used which increases the sensitivity. For example, preferred infrared supersensitizers are described in European Laid Open Patent Application No. 0 559 228 and include heteroaromatic mercapto compounds or heteroaromatic disulfide compounds of the formulae:

Ar—S—M

Ar—S—S—Ar wherein: M represents a hydrogen atom or an alkali metal atom.

In the above noted supersensitizers, Ar represents an aromatic ring or fused aromatic ring containing one or more of nitrogen, sulfur, oxygen, selenium or tellurium atoms. Preferably, the heteroaromatic ring is benzimidazole, naphthimidazole, benzothiazole, naphthothiazole, benzoxazole, naphthoxazole, benzoselenazole, benzotellurazole, imidazole, oxazole, pyrazole, triazole, thiadiazole, tetrazole, triazine, pyrimidine, pyridazine, pyrazine, pyridine, purine, quinoline or quinazolinone. However, other heteroaromatic rings are envisioned under the breadth of this invention.

The heteroaromatic ring may also carry substituents with examples of preferred substituents being selected from the group consisting of halogen (e.g., Br and Cl), hydroxy, amino, carboxy, alkyl (e.g., of 1 or more carbon atoms, preferably 1 to 4 carbon atoms) and alkoxy (e.g., of 1 or more carbon atoms, preferably of 1 to 4 carbon atoms.

Preferred supersensitizers are 2-mercaptobenzimidazole, 2-mercapto-5-methylbenzimidazole, 2-mercaptobenzothiazole, and 2-mercaptobenzoxazole.

The supersensitizers are used in a general amount of at least 0.001 moles of sensitizer per mole of silver in the emulsion layer. Usually the range is between 0.001 and 1.0 moles of the compound per mole of silver and preferably between 0.01 and 0.3 moles of compound per mole of silver.

The Non-Photosensitive Reducible Silver Source Material

When used in photothermographic and thermographic elements, the present invention includes a non-photosensitive reducible silver source. The non-photosensitive reducible silver source that can be used in the present invention can be any material that contains a source of reducible silver ions. Preferably, it is a silver salt which is comparatively stable to light and forms a silver image when heated to 80° C. or higher in the presence of an exposed photocatalyst (such as silver halide) and a reducing agent.

Silver salts of organic acids, particularly silver salts of long chain fatty carboxylic acids, are preferred. The chains typically contain 10 to 30, preferably 15 to 28, carbon atoms. Suitable organic silver salts include silver salts of organic compounds having a carboxyl group. Examples thereof include a silver salt of an aliphatic carboxylic acid and a silver salt of an aromatic carboxylic acid. Preferred examples of the silver salts of aliphatic carboxylic acids include silver behenate, silver stearate, silver oleate, silver laurate, silver caprate, silver myristate, silver palmitate, silver maleate, silver fumarate, silver tartarate, silver furoate, silver linoleate, silver butyrate, silver camphorate, and mixtures thereof, etc. Silver salts that can be substituted with a halogen atom or a hydroxyl group also can be effectively used. Preferred examples of the silver salts of aromatic carboxylic acid and other carboxyl group-containing compounds include: silver benzoate, a silver-substituted benzoate, such as silver 3,5-dihydroxybenzoate, silver o-methylbenzoate, silver m-methylbenzoate, silver p-methylbenzoate, silver 2,4-dichlorobenzoate, silver acetamidobenzoate, silver p-phenylbenzoate, etc.; silver gallate; silver tannate; silver phthalate; silver terephthalate; silver salicylate; silver phenylacetate; silver pyromellilate; a silver salt of 3-carboxymethyl-4-methyl-4-thiazoline-2-thione or the like as described in U.S. Pat. No. 3,785,830; and a silver salt of an aliphatic carboxylic acid containing a thioether group as described in U.S. Pat. No. 3,330,663.

Silver salts of compounds containing mercapto or thione groups and derivatives thereof can also be used. Preferred examples of these compounds include: a silver salt of 3-mercapto-4-phenyl-1,2,4-triazole; a silver salt of 2-mercaptobenzimidazole; a silver salt of 2-mercapto-5-aminothiadiazole; a silver salt of 2-(2-ethylglycolamido)benzothiazole; a silver salt of thioglycolic acid, such as a silver salt of a S-alkylthioglycolic acid (wherein the alkyl group has from 12 to 22 carbon atoms); a silver salt of a dithiocarboxylic acid such as a silver salt of dithioacetic acid; a silver salt of thioamide; a silver salt of 5-carboxylic-1-methyl-2-phenyl-4-thiopyridine; a silver salt of mercaptotriazine; a silver salt of 2-mercaptobenzoxazole; a silver salt as described in U.S. Pat. No. 4,123,274, for example, a silver salt of a 1,2,4-mercaptothiazole derivative, such as a silver salt of 3-amino-5-benzylthio-1,2,4-thiazole; and a silver salt of a thione compound, such as a silver salt of 3-(2-carboxyethyl)-4-methyl-4-thiazoline-2-thione as disclosed in U.S. Pat. No. 3,201,678.

Furthermore, a silver salt of a compound containing an imino group can be used. Preferred examples of these compounds include: silver salts of benzotriazole and substituted derivatives thereof, for example, silver methylbenzotriazole and silver 5-chlorobenzotriazole, etc.; silver salts of 1,2,4-triazoles or 1-H-tetrazoles as described in U.S. Pat. No. 4,220,709; and silver salts of imidazoles and imidazole derivatives.

Silver salts of acetylenes can also be used. Silver acetylides are described in U.S. Pat. Nos. 4,761,361 and 4,775,613.

It is also found convenient to use silver half soaps. A preferred example of a silver half soap is an equimolar blend of silver behenate and behenic acid, which analyzes for about 14.5% silver and which is prepared by precipitation from an aqueous solution of the sodium salt of commercial behenic acid.

Transparent sheet materials made on transparent film backing require a transparent coating. For this purpose a silver behenate full soap, containing not more than about 15% of free behenic acid and analyzing about 22% silver, can be used.

The method used for making silver soap emulsions is well known in the art and is disclosed in *Research Disclosure*, April 1983, item 22812, *Research Disclosure*, October 1983, item 23419, and U.S. Pat. No. 3,985,565.

The silver halide and the non-photosensitive reducible silver source material that form a starting point of development should be in catalytic proximity, i.e., reactive association. "Catalytic proximity" or "reactive association" means that they should be in the same layer, in adjacent layers, or in layers separated from each other by an intermediate layer having a thickness of less than 1 micrometer (1 μm). It is preferred that the silver halide and the non-photosensitive reducible silver source material be present in the same layer.

Photothermographic emulsions containing pre-formed silver halide in accordance with this invention can be sensitized with chemical sensitizers, or with spectral sensitizers as described above.

The source of reducible silver material generally constitutes about 5 to about 70% by weight of the emulsion layer. It is preferably present at a level of about 10 to about 50% by weight of the emulsion layer.

The Binder

The photosensitive silver halide, the non-photosensitive reducible source of silver, the reducing agent system, and any other addenda used in the present invention are generally added to at least one binder. The binder(s) that can be used in the present invention can be employed individually or in combination with one another. It is preferred that the binder be selected from polymeric materials, such as, for example, natural and synthetic resins that are sufficiently polar to hold the other ingredients in solution or suspension.

A typical hydrophilic binder is a transparent or translucent hydrophilic colloid. Examples of hydrophilic binders include: a natural substance, for example, a protein such as gelatin, a gelatin derivative, a cellulose derivative, etc.; a polysaccharide such as starch, gum arabic, pullulan, dextrin, etc.; and a synthetic polymer, for example, a water-soluble polyvinyl compound such as polyvinyl alcohol, polyvinyl pyrrolidone, acrylamide polymer, etc. Another example of a hydrophilic binder is a dispersed vinyl compound in latex form which is used for the purpose of increasing dimensional stability of a photographic element.

Examples of typical hydrophobic binders are polyvinyl acetals, polyvinyl chloride, polyvinyl acetate, cellulose acetate, polyolefins, polyesters, polystyrene, polyacrylonitrile, polycarbonates, methacrylate copolymers, maleic anhydride ester copolymers, butadiene-styrene copolymers, and the like. Copolymers, e.g., terpolymers, are also included in the definition of polymers. The polyvinyl acetals, such as polyvinyl butyral and polyvinyl formal, and vinyl copolymers such as polyvinyl acetate and polyvinyl chloride are particularly preferred.

Although the binder can be hydrophilic or hydrophobic, preferably it is hydrophobic in the silver containing layer(s). Optionally, these polymers may be used in combination of two or more thereof.

The binders are preferably used at a level of about 30–90% by weight of the emulsion layer, and more preferably at a level of about 45–85% by weight. Where the proportions and activities of the reducing agent system for the non-photosensitive reducible source of silver require a particular developing time and temperature, the binder should be able to withstand those conditions. Generally, it is preferred that the binder not decompose or lose its structural integrity at 250° F. (121° C.) for 60 seconds, and more preferred that it not decompose or lose its structural integrity at 350° F. (177° C.) for 60 seconds.

The polymer binder is used in an amount sufficient to carry the components dispersed therein, that is, within the effective range of the action as the binder. The effective range can be appropriately determined by one skilled in the art.

Photothermographic and Thermographic Formulations

The formulation for the photothermographic and thermographic emulsion layer can be prepared by dissolving and dispersing the binder, the photosensitive silver halide, (when used) the non-photosensitive reducible source of silver, the reducing agent system for the non-photosensitive reducible silver source, and optional additives, in an inert organic solvent, such as, for example, toluene, 2-butanone, or tetrahydrofuran.

The use of "toners" or derivatives thereof which improve the image, is highly desirable, but is not essential to the element. Toners can be present in an amount of about 0.01–10% by weight of the emulsion layer, preferably about 0.1–10% by weight. Toners are well known materials in the photothermographic and thermographic art, as shown in U.S. Pat. Nos. 3,080,254; 3,847,612; and 4,123,282.

Examples of toners include: phthalimide and N-hydroxyphthalimide; cyclic imides, such as succinimide, pyrazoline-5-ones, quinazolinone, 1-phenylurazole, 3-phenyl-2-pyrazoline-5-one, and 2,4-thiazolidinedione; naphthalimides, such as N-hydroxy-1,8-naphthalimide; cobalt complexes, such as cobaltic hexamine trifluoroacetate; mercaptans such as 3-mercapto-1,2,4-triazole, 2,4-dimercaptopyrimidine, 3-mercapto-4,5-diphenyl-1,2,4-triazole and 2,5-dimercapto-1,3,4-thiadiazole; N-(aminomethyl)aryldicarboximides, such as (N,N-dimethylaminomethyl)phthalimide, and N-(dimethylaminomethyl)naphthalene-2,3-dicarboximide; a combination of blocked pyrazoles, isothiuronium derivatives, and certain photobleach agents, such as a combination of N,N'-hexamethylene-bis(1-carbamoyl-3,5-dimethylpyrazole), 1,8-(3,6-diazaoctane)bis(isothiuronium)trifluoroacetate, and 2-(tribromomethylsulfonyl benzothiazole); merocyanine dyes such as 3-ethyl-5-[(3-ethyl-2-benzothiazolinylidene)-1-methyl-ethylidene]-2-thio-2,4-o-azolidinedione; phthalazinone, phthalazinone derivatives, or metal salts or these derivatives, such as 4-(1-naphthyl)phthalazinone, 6-chlorophthalazinone, 5,7-dimethoxyphthalazinone, and 2,3-dihydro-1,4-phthalazinedione; a combination of phthalazine plus one or more phthalic acid derivatives, such as phthalic acid, 4-methylphthalic acid, 4-nitrophthalic acid, and tetrachlorophthalic anhydride, quinazolinediones, benzoxazine or naphthoxazine derivatives; rhodium complexes functioning not only as tone modifiers but also as sources of halide ion for silver halide formation in situ, such as ammonium hexachlororhodate (III), rhodium bromide, rhodium nitrate, and potassium hexachlororhodate (III); inorganic peroxides and persulfates, such as ammonium peroxydisulfate and hydrogen peroxide; benzoxazine-2,4-diones, such as 1,3-benzoxazine-2,4-dione, 8-methyl-1,3-benzoxazine-2,4-dione, and 6-nitro-1,3-benzoxazine-2,4-dione; pyrimidines and asym-triazines, such as 2,4-dihydroxypyrimidine, 2-hydroxy-4-aminopyrimidine, and azauracil; and tetraazapentalene derivatives, such as 3,6-dimercapto-1,4-diphenyl-1H, 4H-2,3a5,6a-tetraazapentalene and 1,4-di-(o-chlorophenyl)-3,6-dimercapto-1H,4H-2,3a5,6a-tetraazapentalene.

The photothermographic elements used in this invention can be further protected against the production of fog and can be stabilized against loss of sensitivity during storage. While not necessary for the practice of the invention, it may be advantageous to add mercury (II) salts to the emulsion layer(s) as an antifoggant. Preferred mercury (II) salts for this purpose are mercuric acetate and mercuric bromide.

Other suitable antifoggants and stabilizers, which can be used alone or in combination, include the thiazolium salts described in U.S. Pat. Nos. 2,131,038 and U.S. Pat. No. 2,694,716; the azaindenes described in U.S. Pat. Nos. 2,886,437; the triazaindolizines described in U.S. Pat. No. 2,444,605; the mercury salts described in U.S. Pat. No. 2,728,663; the urazoles described in U.S. Pat. No. 3,287,135; the sulfocatechols described in U.S. Pat. No. 3,235,652; the oximes described in British Pat. No. 623,448; the polyvalent metal salts described in U.S. Pat. No. 2,839,405; the thiuronium salts described in U.S. Pat. No. 3,220,839; and palladium, platinum and gold salts described in U.S. Pat. Nos. 2,566,263 and 2,597,915. Stabilizer precursor compounds capable of releasing stabilizers upon application of heat during development can also be use in combination with the stabilizers of this invention. Such precursor compounds are described in, for example, U.S. Pat. Nos. 5,158,866, 5,175,081, 5,298,390, and 5,300,420.

Photothermographic and thermographic elements of the invention can contain plasticizers and lubricants such as polyalcohols and diols of the type described in U.S. Pat. No. 2,960,404; fatty acids or esters, such as those described in U.S. Pat. Nos. 2,588,765 and 3,121,060; and silicone resins, such as those described in British Pat. No. 955,061.

Photothermographic and thermographic elements containing emulsion layers described herein may contain matting agents such as starch, titanium dioxide, zinc oxide, silica, and polymeric beads including beads of the type described in U.S. Pat. Nos. 2,992,101 and 2,701,245.

Emulsions in accordance with this invention may be used in photothermographic and thermographic elements which contain antistatic or conducting layers, such as layers that comprise soluble salts, e.g., chlorides, nitrates, etc., evaporated metal layers, ionic polymers such as those described in U.S. Pat. Nos. 2,861,056, and 3,206,312 or insoluble inorganic salts such as those described in U.S. Pat. No. 3,428,451.

The photothermographic and thermographic elements of this invention may also contain electroconductive underlayers to reduce static electricity effects and improve transport through processing equipment. Such layers are described in U.S. Pat. No. 5,310,640.

Photothermographic Constructions

The photothermographic and thermographic elements of this invention may be constructed of one or more layers on a support. Single layer elements should contain the silver halide (when used), the non-photosensitive, reducible silver source material, the reducing agent system for the non-photosensitive reducible silver source, the binder as well as optional materials such as toners, acutance dyes, coating aids, and other adjuvants.

Two-layer constructions should contain silver halide (when used) and non-photosensitive, reducible silver source in one emulsion layer (usually the layer adjacent to the support) and the other ingredients in the second layer or distributed between both layers. Two layer constructions comprising a single emulsion layer coating containing all the ingredients and a protective topcoat are envisioned.

Photothermographic and thermographic emulsions used in this invention can be coated by various coating procedures including wire wound rod coating, dip coating, air knife coating, curtain coating, or extrusion coating using hoppers of the type described in U.S. Pat. No. 2,681,294. If desired, two or more layers can be coated simultaneously by the procedures described in U.S. Pat. Nos. 2,761,791; 5,340,613; and British Pat. No. 837,095. Typical wet thickness of the emulsion layer can be about 10–150 micrometers (μm), and the layer can be dried in forced air at a temperature of about 20°–100° C. It is preferred that the thickness of the layer be selected to provide maximum image densities greater than 0.2, and, more preferably, in the range 0.5 to 4.0, as measured by a MacBeth Color Densitometer Model TD 504.

Photothermographic and thermographic elements according to the present invention can contain acutance dyes and antihalation dyes. The dyes may be incorporated into the photothermographic emulsion layer as acutance dyes according to known techniques. The dyes may also be incorporated into antihalation layers according to known techniques as an antihalation backing layer, an antihalation underlayer or as an overcoat. It is preferred that the photothermographic elements of this invention contain an antihalation coating on the support opposite to the side on which the emulsion and topcoat layers are coated. Antihalation and acutance dyes useful in the present invention are described in U.S. Pat. Nos. 5,135,842; 5,226,452; 5,314,795.

Development conditions will vary, depending on the construction used, but will typically involve heating the imagewise exposed material at a suitably elevated temperature. When used in a photothermographic element, the latent image obtained after exposure can be developed by heating the material at a moderately elevated temperature of, for example, about 80°–250° C., preferably about 100°–200° C., for a sufficient period of time, generally about 1 second to about 2 minutes. Heating may be carried out by the typical heating means such as a hot plate, an iron, a hot roller, a heat generator using carbon or titanium white, or the like.

If desired, the imaged element may be subjected to a first heating step at a temperature and for a time sufficient to intensify and improve the stability of the latent image but insufficient to produce a visible image and later subjected to a second heating step at a temperature and for a time sufficient to produce the visible image. Such a method and its advantages are described in U.S. Pat. No. 5,279,928.

When used in a thermographic element, the image may be developed merely by heating at the above noted temperatures using a thermal stylus or print head, or by heating while in contact with a heat absorbing material.

Thermographic elements of the invention may also include a dye to facilitate direct development by exposure to laser radiation. Preferably the dye is an infrared absorbing dye and the laser is a diode laser emitting in the infrared. Upon exposure to radiation the radiation absorbed by the dye is converted to heat which develops the thermographic element.

The Support

Photothermographic and thermographic emulsions used in the invention can be coated on a wide variety of supports. The support, or substrate, can be selected from a wide range of materials depending on the imaging requirement. Supports may be transparent or at least translucent. Typical supports include polyester film, subbed polyester film (e.g., polyethylene terephthalate or polyethylene naphthalate), cellulose acetate film, cellulose ester film, polyvinyl acetal film, polyolefinic film (e.g., polethylene or polypropylene or blends thereof), polycarbonate film and related or resinous materials, as well as glass, paper, and the like. Typically, a flexible support is employed, especially a polymeric film support, which can be partially acetylated or coated, particularly with a polymeric subbing or priming agent. Preferred polymeric materials for the support include polymers having good heat stability, such as polyesters. Particularly preferred polyesters are polyethylene terephthalate and polyethylene naphthalate.

Where the photothermographic or thermographic element is to be used as a photomask, the support should be transparent or highly transmissive of the radiation (i.e., ultraviolet or short wavelength visible radiation) which is used in the final imaging process.

A support with a backside resistive heating layer can also be used in photothermographic imaging systems such as shown in U.S. Pat. No. 4,374,921.

Use as a Photomask

As noted above, the possibility of low absorbance of the photothermographic and thermographic element in the range of 350–450 nm in non-imaged areas facilitates the use of the photothermographic and thermographic elements of the present invention in a process where there is a subsequent exposure of an ultraviolet or short wavelength visible radiation sensitive imageable medium. For example, imaging the photothermographic or thermographic element and subsequent development affords a visible image. The developed photothermographic or thermographic element absorbs ultraviolet or short wavelength visible radiation in the areas where there is a visible image and transmits ultraviolet or short wavelength visible radiation where there is no visible image. The developed element may then be used as a mask and placed between an ultraviolet or short wavelength visible radiation energy source and an ultraviolet or short wavelength visible radiation photosensitive imageable medium such as, for example, a photopolymer, diazo material, or photoresist. This process is particularly useful where the imageable medium comprises a printing plate and the photothermographic or thermographic element serves as an imagesetting film.

Objects and advantages of this invention will now be illustrated by the following examples, but the particular materials and amounts thereof recited in these examples, as well as other conditions and details, should not be construed to unduly limit this invention.

EXAMPLES

All materials used in the following examples are readily available from standard commercial sources, such as Aldrich Chemical Co. Milwaukee, Wis., unless otherwise specified. All percentages are by weight unless otherwise indicated. The following additional terms and materials were used.

Acryloid™ A-21 is an acrylic copolymer available from Rohm and Haas, Philadelphia, Pa.

Butvar™ B-79 is a polyvinyl butyral resin available from Monsanto Company, St. Louis, Mo.

CAB 171-15S is a cellulose acetate butyrate resin available from Eastman Kodak Co.

CBBA is 2-(4-chlorobenzoyl)benzoic acid.

Desmodur™ N3300 is an aliphatic hexamethylene diisocyanate available from Bayer Chemicals, Pittsburgh, Pa.

2-MBO is 2-mercaptobenzoxazole.

MEK is methyl ethyl ketone (2-butanone).

MeOH is methanol.

MMBI is 2-mercapto-5-methylbenzimidazole.

4-MPA is 4-methylphthalic acid.

Permanax™ WSO is 1,1-bis(2-hydroxy-3,5-dimethylphenyl)-3,5,5-trimethylhexane [CAS RN=7292-14-0] and is available from St-Jean PhotoChemicals, Inc. Quebec. It is a reducing agent (i.e., a hindered phenol developer) for the non-photosensitive reducible source of silver. It is also known as Nonox™.

PET is polyethylene terephthalate.

PHP is pyridinium hydrobromide perbromide.

PHZ is phthalazine.

TCPA is tetrachlorophthalic acid.

Sensitizing Dye-1 is described in U.S. Pat. No. 5,441,866 and has the structure shown below

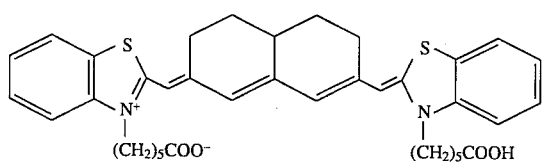

Sensitizing Dye-2 is described in U.S. patent application Ser. No. 425,860 (filed Apr. 20, 1995) and has the structure shown below.

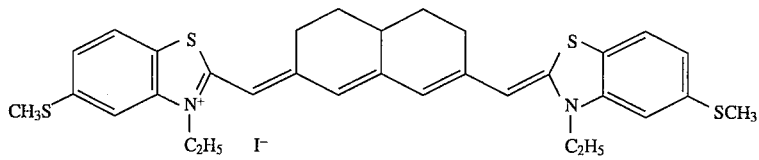

Antifoggant A is 2-(tribromomethylsulfonyl)quinoline. Its preparation is disclosed in European Laid Open Patent Application No 0 63 1176. It has the structure shown below.

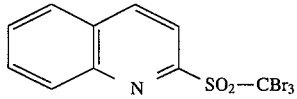

Fluorinated Terpolymer A (FT-A) has the following random polymer structure, where m=7, n=2 and p=1. The preparation of fluorinated terpolymer A is described in U.S. Pat. No. 5,380,644.

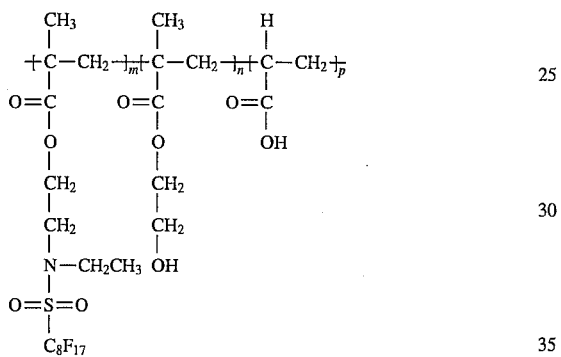

Vinyl Sulfone-1 (VS-1) is described in European Laid Open Patent Application No. 0 600 589 A2 and has the following structure.

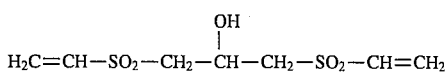

Antihalation Dye-1 (AH-1) has the following structure. The preparation of this compound is described in Example 1f of U.S. Pat. No. 5,380,635.

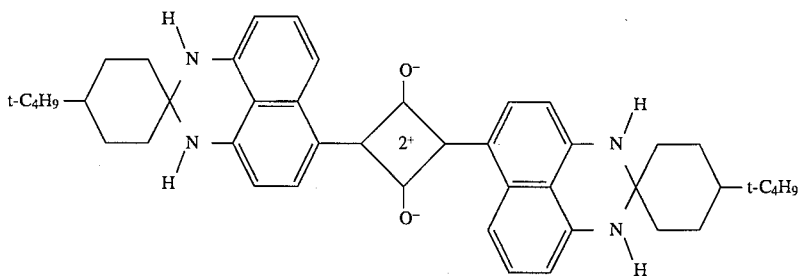

Antihalation Dye-2 (AH-2) has the following structure. The preparation of this compound is described in European Laid open Patent Application No 0 342 810.

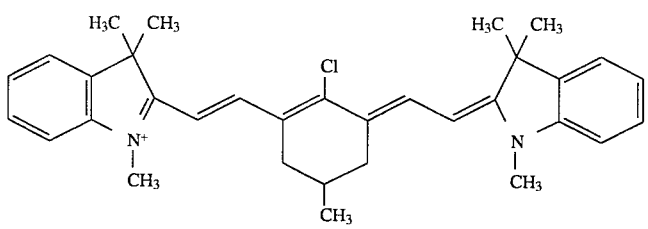

Samples were coated out under infrared safelights using a dual-knife coater. The photothermographic emulsion and topcoat formulations were coated onto a polyethylene terephthalate support provided with an antihalation back coating containing AH-1 in CAB 171-15S resin. After raising the hinged knives, the support was placed in position on the coater bed. The knives were then lowered and locked into place. The height of the knives was adjusted with wedges controlled by screw knobs and measured with electronic gauges. Knife #1 was raised to a clearance corresponding to the desired thickness of the support plus the wet thickness of layer #1. Knife #2 was raised to a height equal to the desired thickness of the support plus the wet thickness of layer #1 plus the wet thickness of layer #2.

Aliquots of solutions #1 and #2 were simultaneously poured onto the support in front of the corresponding knives. The support was immediately drawn past the knives and into an oven to produce a double layered coating. The coated photothermographic or thermographic element was then dried by taping the support to a belt which was rotated inside a Blue™ oven.

Examples 1–3 were coated onto a 7 mil (177.8 μm) polyethylene terephthalate support. Examples 4–12 were coated onto a 4 mil (101 μm) polyethylene terephthalate support.

The following examples provide exemplary synthetic procedures and preparatory procedures using the compounds of the invention.

Synthesis of Acrylonitriles

Compounds CN-01 and CN-02 were available from Aldrich Chemical Company.

Preparation of 3-hydroxy-2-cyanoacrylic acid Ethyl ester (CN-03): To a methanolic solution of CN-08 (prepared as shown below) was added 2N HCl until acidic. The resulting solution was evaporated to dryness. The product was then purified by vacuum distillation to yield the desired product.

Preparation of 3-ethoxy-2-(phenylsulfonyl)propenenitrile (CN-04): A solution of (phenylsulfonyl)acetonitrile (10.5 g, 0.089 mol) in triethyl orthoformate (21 mL, 0.14 mol) and acetic anhydride (21 mL, 0.2 mol) was heated at 160° C. with removal of ethyl acetate (35 mL). The dark oily residue was dissolved in methanol (60 mL) and the solution was concentrated and recrystallized from hexanes/ethyl acetate to yield (11.98 g, 78%) of the desired product.

Compounds CN-05, and CN-06 were prepared in a manner similar to that described for compound CN-03.

Preparation of 3-hydroxy-2-cyanoacrylic acid ethyl ester potassium salt (CN-08): To a solution of 3-ethoxy-2-cyanoacrylic (100 g, 0.61 mol) in 50 mL of methanol was added potassium hydroxide (37.3 g, 0.67 mol). The solution was filtered and evaporated to dryness to yield 83 g of the desired product.

Preparation of 3-chloro-2-cyanoacrylic acid ethyl ester (CN-09): Ethyl 3-chloro-2-cyanoacrylic acid was prepared according to the procedure of *Chem. Ber.* 1970, 103, 1982–1991.

Compounds CN-10, CN-11, and CN-12 were prepared in a manner similar to that described in G. de Bellemont *Bull. Soc. Chim. France* 1901, 25, 18 and *Bull. Soc. Chim. France* 1901, 25, 35.

Preparation of Ethyl 3-thiohexadecyl-2-cyanoacrylic acid (CN-13): To a solution of 3-ethoxy-2-cyanoacrylic (2.0 g, 0.012 mol) in 50 mL of acetone was added hexadecylthiol (3.1 g, 0.012 mol). The solution was stirred over potassium carbonate overnight, filtered, and evaporated to dryness to yield 2.2 g of the desired product.

Hydrazide Syntheses

General Procedure for the Synthesis of Trityl Hydrazides

Procedure-A: A solution of 126 mmol of the appropriate hydrazide and 222 mmol of $Et_3N$ in 600 mL of acetonitrile was prepared at room temperature. To this was added 126 mmol of chlorotriphenylmethane. The mixture was then heated to 40° C. for approximately 2 hours. The mixture became very thick and stirring became somewhat difficult. The mixture was poured into water and filtered. The solid was then recrystallized from ethanol.

Procedure-B: A mixture of 27.6 g (99 mmol) of chlorotriphenylmethane in 130 mL of DMF was stirred vigorously. To this was added a solution of 13.1 g (99 mmol) of t-butyl carbazate and 15.8 g (200 mmol) of triethylamine in 20 mL of DMF dropwise. The mixture was stirred at room temperature for several hours. The mixture was filtered and while the filtrate was stirred vigorously, approximately 300 mL of ice water was added. The solid thus precipitated was filtered off and recrystallized from methanol.

Procedure-C: A solution of 30 mmol of the appropriate hydrazide and 30 mmol of chlorotriphenylmethane in 100 mL of pyridine was prepared and stirred. After stirring at room temperature for several hours, the mixture was poured into water. The solid was collected by filtration and washed thoroughly with water. The solid was then recrystallized from ethanol to provide the desired triphenylmethyl hydrazide.

Compound H-1 was prepared according to General Procedure-A described above, using 10.0 g of octanoic hydrazide, 8.8 g of triethylamine, 17.6 g of trityl chloride and 316 mL of acetonitrile. The normal workup procedure was followed and yielded 17.0 g (67%) of the desired product.

Compounds H-2, H-3, H-5, and H-25 were synthesized according to General Procedure-C.

Compound H-4 was prepared according to General Procedure-A using 10.0 g of benzoic hydrazide, 7.1 g of triethylamine, 20.5 g of trityl chloride and 150 mL of acetonitrile. The mixture was heated to 50° C. for 2 hours, then worked up in the normal fashion. The solid was then recrystallized to provide 11.5 g (41% yield) of the desired product.

Compound H-6 was prepared according to General Procedure-A, using 5.0 g of 3-hydroxybutyric acid hydrazinc, 4.35 g of triethylamine, 11.8 g of trityl chloride and 250 mL of acetonitrile. The mixture was heated for 2 hours then was cooled and poured into ice water. The solid then isolated was recrystallized from 1:1 hexane:ethyl acetate to provide the desired compound, m.p. 148°–150° C.

Compound H-7 was prepared according to General Procedure-A using 5.0 g of 4-nitrophenoxyacetic acid hydrazide, 4.0 g of triethylamine, 6.6 g of trityl chloride and 100 mL of acetonitrile. Normal workup and recrystallization provided 3.0 g (30% yield) of the desired product.

Compound H-8 was prepared according to General Procedure-A using 3.55 g of 2-thiophenecarboxylic acid, 3.16 g of triethylamine, 6.96 g of trityl chloride, and 150 mL of acetonitrile. The normal workup procedure was followed to provide 5.5 g (57% yield) of the desired compound, m.p. 185°–190° C.

Compound H-9 was prepared according to General Procedure-A using 10.0 g of isonicotinic acid hydrazide, 7.9 g of triethylamine, 20.3 g of trityl chloride and 400 mL of acetonitrile. The mixture was heated for 2 hours at 50° C. The normal workup procedure was followed to provide 10.7 g (37% yield) of the desired product as colorless, cubic crystals, m.p. 192°–194° C.

Compound H-10 was prepared according to General Procedure-B. t-Butyl carbazate (5.0 g) and of triethylamine (3.8 g) were dissolved in 45 mL of N,N-dimethylformamide (DMF). To this was added 10.5 g of trityl chloride in 4.5 mL of DMF. This was stirred overnight at room temperature then filtered. The remaining liquid was stirred vigorously while adding water slowly. A sticky yellowish mass resulted. The water was poured off and the solid was recrystallized from MeOH to provide the desired product as an off-white solid, 7.8 g (55% yield), m.p. 119°–122° C.

Compound H-11 was prepared according to General Procedure-A using 5.7 g of phenylacetylhydrazine, 3.6 g of triethylamine, 10.6 g of trityl chloride and 50 mL of acetonitrile. The mixture immediately became very thick with a white precipitate. The mixture was heated for 1 hour at 50° C., then the normal workup was followed. Recrystallization from 1:1 MeOH:EtOH provided 7.0 g of the desired product (47% yield).

Compound H-12 was prepared in an analogous manner to H-10.

Compounds H-13, H-20, H-21, H-22, H-23, H-24, H-26, H-27, and H-29 were also synthesized according to General Procedure-A from the appropriate hydrazine and appropriate trityl chloride.

Compound H-28 was prepared from methylthioacetyl hydrazine and triphenylmethyl chloride.

Preparation of Methylthioacetyl hydrazine: Ethyl methylthioacetate (40.0 g, 300 mmol) and hydrazine monohydrate (20.0 g, 400 mmol) were heated overnight at gentle reflux under nitrogen. Upon cooling, the solvent was removed at reduced pressure to provide methylthioacetyl hydrazine in nearly quantitative yield. $^1$H NMR and TLC indicated the material to be very pure. $^1$H NMR was in agreement with the desired structure.

Preparation of 1-(Methylthio)acetyl-2-triphenylmethylhydrazine: A solution of methylthioacetyl hydrazine prepared above (60.6 g, 500 mmol), Et$_3$N and 1200 mL of acetonitrile was prepared and stirred at room temperature. To this solution was added triphenylmethyl chloride (trityl chloride; 139.4 g, 500 mmol). The reaction mixture became thick and difficult to stir. The magnetic stirrer was replaced with an overhead mechanical stirrer and stirring maintained for 0.5–1.0 hr. The reaction mixture was poured into water of equal volume to the solvent used. The solid was filtered off and the crude solid was recrystallized form approximately 2500 mL of hot ethanol to afford 1-(Methylthio)acetyl-2-triphenylmethylhydrazine (yield 45%; m.p. 149°–151° C.).

Synthesis of Formylphenylhydrazines

Compound H-14 (1-Formyl-2-phenylhydrazine) was prepared by the method outlined in *J. Chem. Soc.* 1950, 3389. Phenylhydrazine 50.0 g (462 mmol) was added slowly to acetic acid 70 g (2.444 mol) maintained at 0° C. in an ice bath. Formamide (10.5 g, 466 mmol) was added dropwise so as not to cause warming. The mixture gradually warmed to room temperature and was stirred for several hours. The mixture was poured into water and filtered. The solid was washed with very dilute acetic acid and then water. The crude material was dried and recrystallized from 200 mL of ethanol to provide 30 g (60% yield) of the desired compound as white, platelike crystals, m.p. 142°–44° C.

Compound H-15 was synthesized in a similar manner as described below for the preparation of H-17.

Compound H-16, is available from Aldrich Chemical Co.

Compound H-17 (1-Formyl-2-(4-methoxyphenyl)hydrazine) was prepared by addition of 5.0 g (28.8 mmol) of 4-methoxyphenylhydrazine hydrochloride to a cooled solution of 18.0 g of acetic acid, followed by addition of 2.61 g (58.0 mmol) of formamide. The mixture was stirred for 3 hours and poured into water. The water was extracted with Et$_2$O and the etheral layer separated and dried over Na$_2$SO$_4$. Filtration and concentration of the solution afforded 1.65 g (38% yield) of the desired compound.

EXAMPLES 1–4

The following examples demonstrate the use of acrylonitrile compounds in combination with hindered phenol developers.

The preparation of a pre-formed silver iodobromide emulsion, silver soap dispersion, homogenate, and halidized homogenate solutions used in the Examples is described below.

Formulation A—The following formulation was prepared. Acrylonitrile co-developers were incorporated in the topcoat layer.

A pre-formed iridium-doped core-shell silver behenate full soap was prepared as described in U.S. Pat. No. 5,434,043 incorporated herein by reference.

The pre-formed soap contained 2.0% by weight of a 0.05 μm diameter iridium-doped core-shell silver iodobromide emulsion (25% core containing 8% iodide, 92% bromide; and 75% all-bromide shell containing $1 \times 10^{-5}$ mole of iridium). A dispersion of this silver behenate full soap was homogenized to 23.1% solids in 2-butanone containing 1.002% Butvar™ B-79 polyvinyl butyral resin.

To 208.0 g of this silver full soap dispersion, was added 27 g of 2-butanone, and 2.10 mL of a solution of 0.135 g of pyridinium hydrobromide perbromide in 1.88 g of methanol.

After 1 hour of mixing 1.50 mL of a solution of 0.100 g of calcium bromide in 1.35 g methanol was added. After 30 minutes the following infrared sensitizing dye premix was added.

| Material | Amount |
|---|---|
| CBBA | 1.400 g |
| Sensitizing Dye-1 | 0.004 g |
| MMBI | 0.128 g |
| Methanol | 4.800 g |

After 1.5 hours of mixing, 40.0 g of Butvar B-79 polyvinyl butyral was added. Stirring for 30 minutes was followed by addition of 1.10 g of 2-tribromomethylsulphonyl quinoline and 10.06 g of 1,1-bis(2-hydroxy-3,5-dimethylphenyl)-3,5,5-trimethylhexane. After 15 minutes 4.97 g of a solution of 0.450 g of Desmodur™ N3300 in 4.7 g of 2-butanone was added. After 15 minutes, 0.450 g of 4-methylphthalic acid and 0.310 g of tetrachlorophthalic acid was added followed by 0.945 g of phthalazine.

A topcoat solution was prepared in the following manner; 4.52 g of Acryloid-21™ polymethyl methacrylate and 115 g of CAB 171-15S cellulose acetate butyrate were mixed in 1.236 Kg of 2-butanone and 147 g of methanol until dissolved. To 100 g of this premix was then added 0.140 g oftetrachlorophthalic acid anhydride.

The acrylonitrile compound was added to a 20 g aliquot of the topcoat solution as described in the Examples below.

Formulation B—The following formulation was prepared. Acrylonitrile co-developers were incorporated in the photothermographic emulsion layer.

A pre-formed iridium-doped core-shell silver behenate full soap was prepared as described in U.S. Pat. No. 5,434,043 incorporated herein by reference.

The pre-formed soap contained 2.0% by weight of a 0.05 μm diameter iridium-doped core-shell silver iodobromide emulsion (25% core containing 8% iodide, 92% bromide; and 75% all-bromide shell containing $1 \times 10^{-5}$ mole of iridium). A dispersion of this silver behenate full soap was homogenized to 23.1% solids in 2-butanone containing 1.00% Butvar™ B-79 polyvinyl butyral resin.

To 208.0 g of this silver full soap dispersion, was added 27 g of 2-butanone, and 2.10 mL of a solution of 0.135 g of pyridinium hydrobromide perbromide in 1.88 g of methanol. After 1 hour of mixing 1.50 mL of a solution of 0.100 g of calcium bromide in 1.35 g methanol was added. After 30 minutes the following infrared sensitizing dye premix was added.

| Material | Amount |
|---|---|
| CBBA | 1.400 g |
| Sensitizing Dye-1 | 0.026 g |
| MMBI | 0.128 g |
| Methanol | 4.800 g |

After 1.5 hours of mixing, 40.0 g of Butvar B-79 polyvinyl butyral was added. Stirring for 30 minutes was followed by addition of 1.10 g of 2-tribromomethylsulphonyl quinoline and 10.45 g of 1,1-bis(2-hydroxy-3,5-dimethylphenyl)-3,5,5-trimethylhexane. After 15 minutes 4.97 g of a solution of 0.270 of Desmodur™ N3300 in 4.7 g of 2-butanone was added. After 15 minutes, 0.316 g of tetrachlorophthalic acid was added followed by 0.945 g of phthalazine. After 15 minutes, the acrylonitrile compound was added to a 30 g aliquot of the infrared sensitized silver premix as described in the Examples below. A topcoat solution was prepared in the following manner; 4.52 g of Acryloid-21™ polymethyl methacrylate and 115 g of CAB 171-15S cellulose acetate butyrate were mixed in 1.236 Kg of 2-butanone and 147 g of methanol until dissolved. To 100 of this premix was then added 0.140 g of tetrachlorophthalic acid anhydride and 0.30 g of 4-methylphthalic acid.

Sensitometry: The coated and dried photothermographic elements prepared from Formulations A, and B were cut into 1.5 inch×8 inch strips (3.8 cm ×20.3 cm) and exposed with a laser sensitometer incorporating a 811 nm laser diode sensitometer for 6 seconds. The coatings were processed on a roll processor for the amount of time indicated in the Examples.

Sensitometry measurements were made on a custom built computer scanned densitometer using a filter appropriate to the sensitivity of the photothermographic element and are believed to be comparable to measurements from commercially available densitometers.

Dmin is the density of the non-exposed areas after development. It is the average of eight lowest density values on the exposed side of the fiducial mark.

Dmax is the highest density value on the exposed side of the fiducial mark.

Speed-2 is Log1/E+4 corresponding to the density value of 1.00 above Dmin where E is the exposure in ergs/cm$^2$.

Speed-3 is Log1/E+4 corresponding to the density value of 2.90 above Dmin where E is the exposure in ergs/cm$^2$.

Contrast-1 is the absolute value of the slope of the line joining the density points of 0.60 and 2.00 above Dmin.

Contrast-3 is the absolute value of the slope of the line joining the density points of 2.40 and 2.90 above Dmin.

Acrylonitrile compounds were studied with a hindered phenol developer system using Permanax™ as the hindered phenol developer. Acrylonitrile compounds studied were CN-01, CN-02, CN-03, CN-04, CN-08, CN-09 and CN-13. The structures of these compounds are shown above.

EXAMPLE 1

To 20.0 g aliquots of topcoat solution prepared as described in Formulation A above, were added one of the following:

$4.1 \times 10^{-4}$ moles CN-01 (−);

$8.2 \times 10^{-4}$ moles CN-01 (0);

$12.3 \times 10^{-4}$ moles CN-01 (+);

$3.0 \times 10^{-4}$ moles CN-02 (−);

$6.0 \times 10^{-4}$ moles CN-02 (+); and $4.2 \times 10^{-4}$ moles CN-04.

A sample containing only Permanax™ developer served as a control. The photothermographic emulsion layer of Formulation A and topcoat layer were dual knife coated onto a 7 mil (178 μm) polyester support containing AH-1 in an antihalation backcoat. The first knife gap for the photothermographic emulsion layer was set to 3.7 mil (94 μm) above the support and the second knife gap for the topcoat layer was set at 5.3 mil (135 μm) above the support. Samples were dried for 4 minutes at 180° F. (82.2° C.) in a BlueM™.

The sensitometric results, shown below, demonstrate that addition of an acrylonitrile compound having an electron withdrawing group at the 2-position increases the contrast, speed, and Dmax of a photothermographic emulsion containing a hindered phenol developer. The sensitometric response is similar to that observed for high contrast hybrid wet silver halide emulsions.

| Ex. | Developer | Processing Conditions | Dmin | Dmax | Speed-2 | Speed-3 | Contrast-1 | Contrast-3 |
|---|---|---|---|---|---|---|---|---|
| 1-1 | Permanax ™ | 15 seconds/255° F. | 0.219 | 3.900 | 1.941 | 1.456 | 5.743 | 2.447 |
| 1-2 | | 25 seconds/255° F. | 0.283 | 3.832 | 2.069 | 1.426 | 3.668 | 2.276 |
| 1-3 | Permanax ™ + CN-01 (−) | 15 seconds/255° F. | 0.208 | 3.845 | 1.888 | 1.775 | 9.634 | 19.988 |
| 1-4 | | 25 seconds/255° F. | 0.234 | 3.992 | 2.088 | 2.048 | 28.882 | 65.206 |
| 1-5 | Permanax ™ + CN-01 (0) | 15 seconds/255° F. | 0.206 | 3.982 | 1.838 | 1.758 | 11.978 | 36.259 |
| 1-6 | | 25 seconds/255° F. | 0.227 | 4.332 | 2.019 | 1.979 | 28.856 | 72.174 |
| 1-7 | Permanax ™ + CN-01 (+) | 15 seconds/255° F. | 0.210 | 4.329 | 1.734 | 1.638 | 9.273 | 31.689 |
| 1-8 | | 25 seconds/255° F. | 0.227 | 4.554 | 1.939 | 1.898 | 27.246 | 68.632 |
| 1-9 | Permanax ™ + CN-02 (−) | 15 seconds/255° F. | 0.240 | 4.950 | 2.070 | 2.014 | 24.630 | 43.172 |
| 1-10 | Permanax ™ + CN-02 (+) | 15 seconds/255° F. | 0.239 | 5.002 | 2.222 | 2.170 | 27.102 | 47.299 |
| 1-11 | Permanax ™ + CN-04 | 15 seconds/255° F. | 0.263 | 5.049 | 1.493 | 1.402 | 16.357 | 20.265 |

EXAMPLE 2

To 20.0 g aliquots of topcoat solution prepared using Formulation A were added one of the following:

$3.5 \times 10^{-4}$ moles CN-03 (−);

$5.3 \times 10^{-4}$ moles CN-03 (+);

$1.3 \times 10^{-4}$ moles CN-08 (−);

$3.0 \times 10^{-4}$ moles CN-08 (+);

$2.1 \times 10^{-4}$ moles CN-13; and $3.0 \times 10^{-4}$ moles CN-09.

A sample containing only Permanax™ developer served as a control.

The photothermographic emulsion layer of Formulation A and topcoat layer were dual knife coated onto a 7 mil (178 μm) polyester support containing AH-1 in an antihalation backcoat. The first knife gap for the photothermographic emulsion layer was set to 3.7 mil (94 μm) above the support and the second knife gap for the topcoat layer was set at 5.3 mil (135 μm) above the support. Samples were dried for 4 minutes at 180° F. (82.2° C.) in a BlueM™.

The sensitometric results, shown below, demonstrate that addition of an acrylonitrile compound having various substituents in the 3-position increases the contrast, speed, and Dmax of a photothermographic emulsion containing a hindered phenol developer. The sensitometric response is similar to that observed for high contrast hybrid wet silver halide emulsions.

$4.1 \times 10^{-3}$ moles CN-01 (−); and $8.2 \times 10^{-3}$ moles CN-01 (+).

A sample containing only Permanax™ developer served as a control.

The photothermographic emulsion layer and topcoat layer of Formulation B were dual knife coated onto a 7 mil (178 μm) polyester support containing AH-1 in an antihalation backcoat. The first knife gap for the photothermographic emulsion layer was set to 3.7 mil (94 μm) above the support and the second knife gap for the topcoat layer was set at 5.3 mil (135 μm) above the support. Samples were dried for 4 minutes at 180° F. (82.2° C.) in a BlueM™ oven.

The results, shown below, demonstrate that the hindered phenol developer and acrylonitrile co-developer can also be incorporated into the photothermographic emulsion layer.

| Ex. | Developer | Processing Conditions | Dmin | Dmax | Speed-2 | Speed-3 | Contrast-1 | Contrast-3 |
|---|---|---|---|---|---|---|---|---|
| 2-1 | Permanax ™ | 15 seconds/255° F. | 0.219 | 3.900 | 1.941 | 1.456 | 5.743 | 2.447 |
| 2-2 | | 25 seconds/255° F. | 0.283 | 3.832 | 2.069 | 1.426 | 3.668 | 2.276 |
| 2-3 | Permanax ™ + CN-03 (−) | 12 seconds/255° F. | 0.206 | 5.055 | 1.957 | 1.916 | 33.469 | 62.803 |
| 2-4 | | 25 seconds/255° F. | 0.230 | 5.124 | 2.170 | 2.116 | 24.522 | 45.213 |
| 2-5 | Permanax ™ + CN-03 (+) | 12 seconds/255° F. | 0.203 | 5.057 | 1.916 | 1.880 | 37.682 | 64.152 |
| 2-6 | | 15 seconds/255° F. | 0.218 | 5.115 | 2.091 | 2.040 | 27.244 | 49.628 |
| 2-7 | Permanax ™ + CN-08 (−) | 15 seconds/255° F. | 0.267 | 4.754 | 2.018 | 2.075 | 25.977 | 41.800 |
| 2-8 | Permanax ™ + CN-08 (+) | 15 seconds/255° F. | 0.229 | 4.740 | 1.993 | 1.951 | 33.363 | 51.699 |
| 2-9 | Permanax ™ + CN-13 | 15 seconds/255° F. | 0.217 | 5.228 | 1.990 | 1.948 | 33.124 | 53.191 |
| 2-10 | | 20 seconds/255° F. | 0.233 | 5.298 | 2.191 | 2.140 | 25.163 | 46.703 |
| 2-11 | Permanax ™ + CN-09 | 15 seconds/255° F. | 0.219 | 5.052 | 2.338 | 2.289 | 25.446 | 48.807 |

EXAMPLE 3

To 300 g of photothermographic emulsion prepared using Formulation B were added one of the following:

| Ex. | Developer | Processing Conditions | Dmin | Dmax | Speed-2 | Speed-3 | Contrast-1 | Contrast-3 |
|---|---|---|---|---|---|---|---|---|
| 3-1 | Permanax ™ | 15 seconds/255° F. | 0.219 | 3.900 | 1.941 | 1.456 | 5.743 | 2.447 |
| 3-2 | | 25 seconds/255° F. | 0.283 | 3.832 | 2.069 | 1.426 | 3.668 | 2.276 |
| 3-3 | Permanax ™ + CN-01 (−) | 15 seconds/255° F. | 0.227 | 3.873 | 1.901 | 1.806 | 10.076 | 29.216 |
| 3-4 | | 25 seconds/255° F. | 0.280 | 4.244 | 2.196 | 2.280 | 29.532 | 55.139 |
| 3-5 | Permanax ™ + CN-01 (+) | 15 seconds/255° F. | 0.222 | 4.119 | 1.862 | 1.776 | 10.715 | 30.377 |
| 3-6 | | 25 seconds/255° F. | 0.264 | 4.393 | 2.157 | 2.114 | 29.020 | 59.119 |

Comparative Example 1

To 30.0 g aliquots of topcoat solution prepared using Formulation A were added one of the following:

$2.3 \times 10^{-3}$ moles F-01;

A sample containing only Permanax™ developer served as a control.

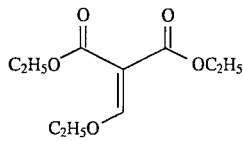

F-01

The photothermographic emulsion layer of Formulation A and topcoat layer were dual knife coated onto a 7 mil (178 μm) polyester support containing AH-1 in an antihalation backcoat. The first knife gap for the photothermographic emulsion layer was set to 3.7 mil (94 μm) above the support and the second knife gap for the topcoat layer was set at 5.3 mil (135 μm) above the support. Samples were dried for 4 minutes at 180° F. (82.2° C.) in a BlueM™.

The sensitometric results, shown below, demonstrate that removal of the nitrile group from the compounds of this invention eliminates contrast enhancement effects.

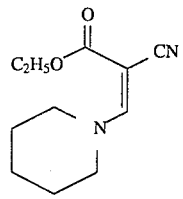

F-02

The photothermographic emulsion layer of Formulation A and topcoat layer were dual knife coated onto a 7 mil (178 μm) polyester support containing AH-1 in an antihalation backcoat. The first knife gap for the photothermographic emulsion layer was set to 3.7 mil (94 μm) above the support and the second knife gap for the topcoat layer was set at 5.3 mil (135 μm) above the support. Samples were dried for 4 minutes at 180° F. (82.2° C.) in a BlueM™.

The sensitometric results, shown below, demonstrate that use of an alkyl amine at the 3-position of the acrylonitrile compound appears to eliminate contrast enhancement effects.

| Ex. | Developer | Processing Conditions | Dmin | Dmax | Speed-2 | Speed | Contrast-1 | Contrast-3 |
|---|---|---|---|---|---|---|---|---|
| C1-1 | Permanax ™ | 15 seconds/255° F. | 0.273 | 3.944 | 1.659 | 1.183 | 5.613 | 2.410 |
| C1-2 | Permanax ™ + F-01 | 15 seconds/255° F. | 0.300 | 3.977 | 1.681 | 1.192 | 4.901 | 2.973 |

Comparative Example 2

To 20.0 g aliquots topcoat solution prepared using Formulation A were added one of the following:

$2.3 \times 10^{-3}$ moles F-02;

A sample containing only Permanax™ developer served as a control. The structure of compound F-02 is shown below.

| Ex. | Developer | Processing Conditions | Dmin | Dmax | Speed-2 | Speed-3 | Contrast-1 | Contrast-3 |
|---|---|---|---|---|---|---|---|---|
| C2-1 | Permanax ™ | 15 seconds/255° F. | 0.218 | 4.124 | 1.733 | 1.410 | 6.948 | 3.846 |
| C2-2 | Permanax ™ + F-02 | 15 seconds/255° F. | 0.217 | 4.296 | 1.746 | 1.453 | 7.087 | 3.987 |

Comparative Example 3

Photothermographic elements were prepared in a manner similar to that described in Comparative Examples 1 and 2, but incorporating acrylonitrile compounds F-03 to F-09. None of the photothermographic elements exhibited the high contrast characterized by compounds of the invention having R and X as defined above. For example, compounds F-06 and F-08 demonstrate the requirement of an electron withdrawing group in addition to at least one nitrile group. Compounds F-03, F-04, F-05, F-07, and F-09 demonstrate the requirements of the R group.

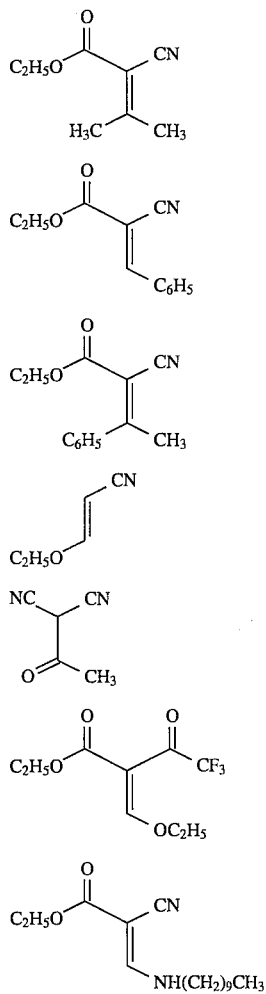

EXAMPLES 4–12

The following examples demonstrate the use of acrylonitrile compounds in combination with hindered phenols, and trityl hydrazide and/or formyl-phenyl hydrazine compounds.

Samples prepared in Examples 1–3 have very different silver emulsion coating weights that those of Examples 4–12. They also have different concentrations of acrylonitrile compounds and were coated onto different supports having different antihalation backcoats. Samples in Examples 1–3 were processed at a 5°–10° C. higher temperature and for a longer period of time than samples in Examples 4–12. In addition, samples of Examples 1–3 were imaged on different laser sensitometers, having different spot size, scan line overlap, and laser contact time than samples of Examples 4–12. Also, samples of Examples 1–3 were evaluated on different densitometers using different computerized programs than samples of Examples 4–12. Thus, the results of Examples 1–3 and 4–12 are not directly comparable.

The following examples provide exemplary synthetic and preparatory procedures using compounds of the invention. Photothermographic and thermographic imaging elements are shown.

Formulation C—A pre-formed iridium-doped core-shell silver behenate full soap was prepared as described in U.S. Pat. No. 5,434,043 incorporated herein by reference.

The pre-formed soap contained 2.0% by weight of a 0.042 $\mu m$ diameter iridium-doped core-shell silver iodobromide emulsion (25% core containing 8% iodide, 92% bromide; and 75% all-bromide shell containing $1 \times 10^{-5}$ mole of iridium). A dispersion of this silver behenate full soap was homogenized to 21.9% solids in 2-butanone containing 1.1% Butvar™ B-79 polyvinyl butyral resin.

To 262.8 g of this silver behenate full soap dispersion was added 1.48 mL of a solution of 0.42 g of pyridinium hydrobromide perbromide in 2.35 g of methanol. After 1 hour of mixing 1.48 mL of a solution of 0.632 g of calcium bromide in 2.35 g of methanol was added. Mixing for 30 minutes was followed by addition of an infrared sensitizing dye solution prepared by mixing the following materials:

| Material | Amount |
| --- | --- |
| CBBA | 3.588 g |
| Sensitizing Dye-2 | 0.0098 g |
| MMBI | 0.134 g |
| 2-MBO | 0.0175 g |
| Methanol | 12.088 g |

After 1 hour of mixing, the temperature was lowered from 70° F. to 55° F. Mixing for an additional 30 minutes at 55° F. was followed by addition of 47.7 g of Butvar™ B-79 polyvinyl butyral. With vigorous stirring for 60 minutes, the following components were added every 15 minutes.

| Material | Amount |
| --- | --- |
| Antifoggant A | 1.794 g |
| Permanax ™ | 14.79 g |
| Desmodur ™ N3300 | 1.215 g dissolved in |
| 2-butanone | 1.215 g |
| PHZ | 1.479 g dissolved in |
| Methanol | 1.75 g |
| TCPA | 0.666 g disolved in |
| 2-butanone | 2.625 g. |
| 4-MPA | 0.739 g dissolved in |
| Methanol | 4.47 g |

The hydrazide and/or acrylonitrile compounds were added to a 15 g aliquot of the infrared sensitized silver premix as described in the Examples below.

A topcoat solution was prepared in the following manner; 1.29 g of Acryloid-21™ polymethyl methacrylate and 33.57 g of CAB 171-15S cellulose acetate butyrate were mixed in 404.7 g of 2-butanone and 53.4 g of methanol until dissolved. To 197.2 g of this CAB solution was then added 0.196 g of VS-1. The topcoat was diluted to with the addition of 42.5 g of 2-butanone.

Formulation D—A pre-formed full soap dispersion was prepared, as described for Formulation C. The sensitizing dye solution was modified and was prepared by mixing the following materials:

| Material | Amount |
| --- | --- |
| CBBA | 3.588 g |
| Sensitizing Dye-1 | 0.0487 g |
| MMBI | 0.134 g |
| 2-MBO | 0.0175 g |
| Methanol | 12.088 g |

After 1 hour of mixing, the temperature was lowered from 70° F. to 55° F. Mixing for an additional 30 minutes at 55° F. was followed by addition of 47.7 g of Butvar™ B-79 polyvinyl butyral. With vigorous stirring for 60 minutes, the following components were added every 15 minutes.

| Material | Amount |
| --- | --- |
| Antifoggant A | 1.794 g |
| Permanax ™ | 14.79 g |
| Desmodur ™ N3300 | 1.215 g dissolved in |
| 2-butanone | 1.215 g |
| PHZ | 1.479 g dissolved in |
| Methanol | 1.75 g |
| TCPA | 0.666 g disolved in |
| 2-butanone | 2.625 g |

The hydrazide and/or acrylonitrile compounds were added to a 15 g aliquot of the infrared sensitized silver premix as described in the Examples below. The topcoat solution was also modified and was prepared as follows.

| Material | Amount |
| --- | --- |
| CAB solution | 197.2 g |
| 4-MPA | 0.686 g |
| FT-A | 1.856 g |
| VS-1 | 0.196 g |
| 2-butanone | 42.5 g |

Formulation E—A pre-formed full soap was prepared as described in Formulation D except that 2.42 g of CBBA was added to the sensitizing dye solution and 0.412 g of 4-MPA was added to the topcoat solution.

The hydrazide and/or acrylonitrile compounds were added to a 15 g aliquot of the infrared sensitized silver premix as described in the Examples below.

Sensitometry: The coated and dried photothermographic elements prepared from Formulations C, D, and E were cut into 1.5 inch×8 inch strips (3.8 cm×20.3 cm) and exposed with a laser sensitometer incorporating a 810 nm laser diode sensitometer for 6 seconds. The coatings were processed on a heated roll processor.

Densitometry measurements were made on a custom built computer scanned densitometer using a filter appropriate to the sensitivity of the photothermographic element and are believed to be comparable to measurements from commercially available densitometers.

Dmin is the density of the non-exposed areas after development. It is the average of eight lowest density values on the exposed side of the fiducial mark.

Dmax is the highest density value on the exposed side of the fiducial mark.

Speed-1 is Log1/E+4 corresponding to the density value of 1.00 above Dmin where E is the exposure in ergs/cm$^2$.

Speed-3 is Log1/E+4 corresponding to the density value of 3.00 above Dmin where E is the exposure in ergs/cm$^2$.

Contrast-A is the absolute value of the slope of the line joining the density points of 0.07 and 0.17 above Dmin.

Contrast-C is the absolute value of the slope of the line joining the density points of 0.50 and 2.50 above Dmin.

Contrast-D is the absolute value of the slope of the line joining the density points of 1.00 and 3.00 above Dmin.

Acrylonitrile compounds were studied with a hydrazide/hindered bis-phenol developer, system using Permanax™ as the hindered bis-phenol developer.

Hydrazides studied were t-butoxytritylhydrazide (H-10), formyl-phenylhydrazine (H-14), and 1-(methylthio)acetyl-2-triphenylmethylhydrazine (H-28). Acrylonitrile compounds studied were CN-01, CN-02, CN-03, CN-08, and CN-13.

EXAMPLE 4

To 15.0 g aliquots of the Formulation D was added 1.0 g of 2-butanone, 0.5 g of methanol, and one of the following:

$2.3 \times 10^{-4}$ moles H-28;

$8.52 \times 10^{-5}$ moles CN-01;

$8.52 \times 10^{-5}$ moles CN-02;

a mixture of $2.3 \times 10^{-4}$ moles H-28 and $8.52 \times 10^{-5}$ moles CN-01;

a mixture of $2.3 \times 10^{-4}$ moles H-28 and $8.52 \times 10^{-5}$ moles CN-02.

A sample containing only Permanax™, a hindered bis-phenol developer, served as a control.

The photothermographic emulsion layer and topcoat layer were dual-knife coated onto a 4 mil (101 μm) polyester support containing AH-2 in an antihalation backcoat. The first knife gap for the photothermographic emulsion layer was set to 2.2 mil (55.9 μm) above the support and the second knife gap for the topcoat layer was set at 3.2 mil (81.3 μm) above the support. Samples were dried for 5 minutes at 185° F. (85.0° C.) in a BlueM™ oven.

The sensitometric results, shown below, demonstrate an increase in both Dmax and contrast upon combination of an acrylonitrile compound with a hydrazide/hindered bis-phenol developer system.

| Ex. | Developer | Processing Conditions | Dmin | Dmax | Speed-1 | Speed-3 | Contrast-A | Contrast-C | Contrast-D |
| --- | --- | --- | --- | --- | --- | --- | --- | --- | --- |
| 4-1 | Permanax ™ | 15 seconds/250° F. | 0.21 | 2.15 | 1.37 | — | 0.73 | — | — |
| 4-2 | Permanax ™ + CN-01 | 15 seconds/250° F. | 0.21 | 2.26 | 1.36 | — | 0.77 | — | — |
| 4-3 | Permanax ™ + CN-02 | 15 seconds/250° F. | 0.21 | 2.24 | 1.39 | — | 0.70 | — | — |
| 4-4 | Permanax ™ + H-28 | 15 seconds/250° F. | 0.23 | 3.51 | 1.71 | 1.56 | 1.23 | 14.94 | 13.91 |
| 4-5 | Permanax ™ + H-28 + CN-01 | 15 seconds/250° F. | 0.23 | 3.79 | 1.67 | 1.56 | 0.98 | 16.12 | 18.56 |
| 4-6 | Permanax ™ + H-28 + CN-02 | 15 seconds/250° F. | 0.24 | 3.84 | 1.73 | 1.62 | 1.20 | 15.09 | 18.75 |

EXAMPLE 5

To 15.0 g aliquots of the Formulation D was added 1.0 g of 2-butanone, 0.5 g of methanol, and one of the following:

$2.30 \times 10^{-4}$ moles H-28;

$3.39 \times 10^{-4}$ moles CN-02;

a combination of $2.30 \times 10^{-4}$ moles H-28 and $3.39 \times 10^{-4}$ moles CN-02.

A sample containing only Permanax™ developer, served as a control.

The photothermographic emulsion layer and topcoat layer were dual-knife coated onto a 4 mil (101 μm) polyester support containing AH-2 in an antihalation backcoat. The first knife gap for the photothermographic emulsion layer was set to 2.4 mil (61.0 gm) above the support and the second knife gap for the topcoat layer was set at 3.5 mil (88.9 μm) above the support. Samples were dried for 5 minutes at 185° F. (85.0° C.) in a BlueM™ oven.

The sensitometric results, shown below, demonstrate an increase in both Dmax and contrast upon combination of an acrylonitrile compound with a hydrazide/hindered bis-phenol developer system.

EXAMPLE 7

To 15.0 g aliquots of Formulation D silver premix was added 1.0 g 2-butanone, 0.5 g methanol, and one of the following:

$8.51 \times 10^{-5}$ moles CN-03;

$2.69 \times 10^{-4}$ moles H-28;

$2.55 \times 10^{-5}$ moles H-14;

a combination of $2.69 \times 10^{-4}$ moles H-28 and $8.51 \times 10^{-5}$ moles CN-03;

a combination of $2.55 \times 10^{-5}$ moles H-14 and $8.51 \times 10^{-5}$ moles CN-03.

A sample containing only Permanax™, a hindered bisphenol developer, served as a control.

The photothermographic emulsion layer of Example 4-1, containing only Permanax™ and its topcoat layer were dual-knife coated onto a 4 mil (101 μm) polyester support containing AH-2 in an antihalation backcoat. The first knife gap for the photothermographic emulsion layer was set to 4.3 mil (106.7 μm) above the support and the second knife gap for the topcoat layer was set at 6.3 mil (160 μm) above the support. Samples were dried for 5 minutes at 185° F.

| Ex. | Developer | Processing Conditions | Dmin | Dmax | Speed-1 | Speed-3 | Contrast-A | Contrast-C | Contrast-D |
|---|---|---|---|---|---|---|---|---|---|
| 5-1 | Permanax ™ CN-02 | 15 seconds/245° F. | 0.20 | 2.33 | 1.16 | — | 0.70 | — | |
| 5-2 | Permanax ™ + H-28 | 15 seconds/245° F. | 0.22 | 3.37 | 1.61 | 1.42 | 0.85 | 13.68 | 10.71 |
| 5-3 | Permanax ™ + H-28 + CN-02 | 15 seconds/245° F. | 0.22 | 3.90 | 1.69 | 1.53 | 1.11 | 14.63 | 13.07 |

EXAMPLE 6

To 15.0 g aliquots of Formulation E silver premix was added 1.0 g 2-butanone, 0.5 g methanol; and one of the following:

$1.92 \times 10^{-4}$ moles H-28;

$3.38 \times 10^{-4}$ moles CN-02;

a combination of $1.92 \times 10^{-4}$ moles H-28 and $3.38 \times 10^{-4}$ moles CN-02.

A sample containing only Permanax™, a hindered bisphenol developer, served as a control.

The photothermographic emulsion layer and topcoat layer were dual-knife coated onto a 4 mil (101 μm) polyester support containing AH-2 in an antihalation backcoat. The first knife gap for the photothermographic emulsion layer was set to 2.4 mil (61.0 μm) above the support and the second knife gap for the topcoat layer was set at 3.5 mil (88.9 μm) above the support. Samples were dried for 5 minutes at 185° F. (85.0° C.) in a BlueM™ oven.

The sensitometric results, shown below, demonstrate an increase in Dmax, speed, and contrast upon combination of an acrylonitrile compound with a hydrazide/hindered bis-phenol developer system.

(85.0° C.) in a BlueM™ oven. The silver coating weight of this element was 2.2 g/m².

The photothermographic emulsion layer of Examples 10-2 to 10-6 and their topcoat layers were dual-knife coated onto a 4 mil (101 μm) polyester support containing an antihalation backcoat. The first knife gap for the photothermographic emulsion layer was set to 2.2 mil (55.9 μm) above the support and the second knife gap for the topcoat layer was set at 3.2 mil (81.3 μm) above the support. Samples were dried for 5 minutes at 185° F. (85.0° C.) in a BlueM™ oven. The silver coating weight of these elements was 1.1 g/m².

The sensitometric results, shown below, demonstrate an increase in Dmax, speed, and contrast upon combination of an acrylonitrile compound with a hydrazide/hindered bisphenol developer system.

| Ex. | Developer | Processing Conditions | Dmin | Dmax | Speed-1 | Speed-3 | Contrast-A | Contrast-C | Contrast-D |
|---|---|---|---|---|---|---|---|---|---|
| 6-1 | Permanax ™ | 11 seconds/250° F. | 0.22 | 2.36 | 1.38 | — | 0.73 | — | — |
| 6-2 | Permanax ™ + CN-02 | 11 seconds/250° F. | 0.21 | 2.47 | 1.29 | — | 0.66 | — | — |
| 6-3 | Permanax ™ + H-28 | 11 seconds/250° F. | 0.22 | 3.22 | 1.51 | — | 0.72 | 9.07 | — |
| 6-4 | Permanax ™ + H-28 + CN-02 | 11 seconds/250° F. | 0.23 | 4.12 | 1.64 | 1.51 | 1.16 | 13.60 | 16.10 |

| Ex. | Developer | Processing Conditions | Dmin | Dmax | Speed-1 | Speed-3 | Contrast-A | Contrast-C | Contrast-D |
|---|---|---|---|---|---|---|---|---|---|
| 7-1 | Permanax ™ | 15 seconds/245° F. | 0.25 | 4.22 | 1.44 | 1.04 | 0.77 | 4.61 | 5.01 |
| 7-2 | Permanax ™ + CN-03 | 15 seconds/245° F. | 0.20 | 3.46 | 1.32 | 1.05 | 1.25 | 10.91 | 7.49 |
| 7-3 | Permanax ™ + H-28 | 15 seconds/245° F. | 0.20 | 3.12 | 1.38 | — | 0.83 | 6.62 | — |
| 7-4 | Permanax ™ + H-14 | 15 seconds/245° F. | 0.21 | 3.31 | 1.54 | 1.31 | 1.43 | 12.05 | 8.87 |
| 7-5 | Permanax ™ + H-28 + CN-03 | 15 seconds/245° F. | 0.20 | 4.07 | 1.56 | 1.43 | 2.43 | 17.28 | 15.75 |
| 7-6 | Permanax ™ + H-14 + CN-03 | 15 seconds/245° F. | 0.20 | 3.85 | 1.52 | 1.37 | 2.44 | 16.17 | 13.90 |

EXAMPLE 8

To 15.0 g aliquots of the Formulation C silver premix was added 1.0 g 2-butanone, 0.5 g methanol, and one of the following:

$1.01 \times 10^{-3}$ moles CN-02;

$8.07 \times 10^{-5}$ moles CN-03;

$1.90 \times 10^{-3}$ moles H-10;

$2.83 \times 10^{-5}$ moles H-14;

$2.0 \times 10^{-4}$ moles H-28;

a combination of $1.01 \times 10^{-3}$ moles CN-02 and $2.83 \times 10^{-5}$ moles H-14;

a combination of $8.07 \times 10^{-5}$ moles CN-03 and $2.83 \times 10^{-3}$ moles H-14;

a combination of $1.01 \times 10^{-3}$ moles CN-02 and $1.90 \times 10^{-3}$ moles H-10;

a combination of $1.01 \times 10^{-3}$ moles CN-02 and $2.0 \times 10^{-3}$ moles H-28;

a combination of $8.07 \times 10^{-5}$ moles CN-03 and $2.0 \times 10^{-3}$ moles H-28.

A sample containing only Permanax™, a hindered bis-phenol developer, served as a control.

The photothermographic emulsion layer and topcoat layer were dual-knife coated onto a 4 mil (101 μm) polyester support containing AH-2 in an antihalation backcoat. The first knife gap for the photothermographic emulsion layer was set to 1.8 mil (45.7 μm) above the support and the second knife gap for the topcoat layer was set at 2.6 mil (66.0 μm) above the support. Samples were dried for 5 minutes at 185° F. (85.0° C.) in a BlueM™ oven. The silver coating weight of these elements was 0.90 g/m².

The sensitometric results, shown below, demonstrate that addition of CN-02, H-28, H-14, or H-10 alone to the Permanax developer system gave low density (<3.0) images but the combination of the acrylonitrile compound with the hydrazide/hindered bis-phenol developer, system increased Dmax, speed, and contrast of these images. While the addition of the CN-03 alone to the Permanax™ hindered bis-phenol developer, gave Dmax>3.0 and high contrast, the addition of a hydrazide in combination with CN-03 further increased the Dmax, speed and the contrast of these images.

| Ex. | Developer | Processing Conditions | Dmin | Dmax | Speed-1 | Speed-3 | Contrast-A | Contrast-C | Contrast-D |
|---|---|---|---|---|---|---|---|---|---|
| 8-1 | Permanax ™ | 15 seconds/245° F. | 0.09 | 1.81 | 1.37 | — | 0.79 | — | — |
| 8-2 | Permanax ™ + CN-02 | 15 seconds/245° F. | 0.08 | 2.61 | 1.79 | — | 1.06 | — | — |
| 8-3 | Permanax ™ + H-14 | 15 seconds/245° F. | 0.09 | 2.95 | 1.92 | — | 2.03 | 9.38 | — |
| 8-4 | Permanax ™ + H-14 + CN-02 | 15 seconds/245° F. | 0.09 | 3.35 | 2.06 | 1.84 | 2.50 | 15.16 | 9.41 |
| 8-5 | Permanax ™ + CN-03 | 15 seconds/245° F. | 0.08 | 3.37 | 1.77 | 1.60 | 2.77 | 16.71 | 11.86 |
| 8-6 | Permanax ™ + CN-03 + H-14 | 15 seconds/245° F. | 0.09 | 3.71 | 1.93 | 1.81 | 2.63 | 18.84 | 17.53 |
| 8-7 | Permanax ™ | 15 seconds/250° F. | 0.09 | 1.80 | 1.48 | — | 0.74 | — | — |
| 8-8 | Permanax ™ + CN-02 | 15 seconds/250° F. | 0.09 | 2.84 | 1.89 | — | 1.96 | 13.69 | — |
| 8-9 | Permanax ™ + H-28 | 15 seconds/250° F. | 0.09 | 2.79 | 1.92 | — | 1.12 | 10.61 | — |
| 8-10 | Permanax ™ + H-10 | 15 seconds/250° F. | 0.08 | 2.50 | 1.81 | — | 1.02 | — | — |
| 8-11 | Permanax ™ + CN-02 + H-28 | 15 seconds/250° F. | 0.09 | 3.39 | 2.01 | 1.91 | 2.36 | 17.53 | 20.07 |
| 8-12 | Permanax ™ + CN-02 + H-10 | 15 seconds/250° F. | 0.09 | 3.57 | 1.96 | 1.89 | 2.73 | 21.92 | 27.80 |
| 8-13 | Permanax ™ + CN-03 | 15 seconds/250° F. | 0.08 | 3.66 | 1.86 | 1.78 | 3.16 | 21.24 | 24.79 |
| 8-14 | Permanax ™ + CN-03 + H-28 | 15 seconds/250° F. | 0.09 | 3.78 | 2.05 | 1.98 | 2.81 | 21.38 | 29.31 |

EXAMPLE 9

To 15.0 g aliquots of Formulation C silver premix was added 1.0 g 2-butanone, 0.5 g methanol, and one of the following:

$2.82 \times 10^{-5}$ moles H-14;

$2.02 \times 10^{-4}$ moles H-28;

$8.04 \times 10^{-5}$ moles CN-08;

$7.51 \times 10^{-5}$ moles CN-13;

a combination of $2.82 \times 10^{-5}$ moles H-14 and $7.51 \times 10^{-5}$ moles CN-13;

a combination of $2.02 \times 10^{-4}$ moles H-28 and $8.04 \times 10^{-5}$ moles CN-08.

A sample containing only Permanax™, a hindered bis-phenol developer, served as a control.

The photothermographic emulsion layer and topcoat layer were dual-knife coated onto a 4 mil (101 μm) polyester support containing AH-2 in an antihalation backcoat. The first knife gall for the photothermographic emulsion layer was set to 1.9 mil (48.3 μm) above the support and the second knife gap for the topcoat layer was set at 2.7 mil (68.6 μm) above the support. Samples were dried for 5 minutes at 185° F. (85.0° C.) in a BlueM™ oven. The silver coating weight of these elements was 0.95 g/m².

The sensitometric results, shown below, demonstrate an increase in Dmax, speed, and contrast upon combination of an acrylonitrile compound with a hydrazide/hindered bisphenol developer system.

EXAMPLE 11

To 15.0 g aliquots of Formulation C silver premix was added 1.0 g 2-butanone, 0.5 g methanol, and one of the following:

$2.83 \times 10^{-5}$ moles H-14;

$2.01 \times 10^{-5}$ moles CN-08;

| Ex. | Developer | Processing Conditions | Dmin | Dmax | Speed-1 | Speed-3 | Contrast-A | Contrast-C | Contrast-D |
|---|---|---|---|---|---|---|---|---|---|
| 9-1 | Permanax ™ | 15 seconds/245° F. | 0.09 | 1.81 | 1.37 | — | 0.79 | — | — |
| 9-2 | Permanax ™ + CN-13 | 15 seconds/245° F. | 0.09 | 2.65 | 1.74 | — | 1.46 | — | — |
| 9-3 | Permanax ™ + H-14 | 15 seconds/245° F. | 0.09 | 2.80 | 1.88 | — | 1.96 | 10.94 | — |
| 9-4 | Permanax ™ + H-14 + CN-13 | 15 seconds/245° F. | 0.11 | 3.47 | 2.03 | 1.83 | 1.89 | 13.51 | 10.42 |
| 9-5 | Permanax ™ + CN-08 | 15 seconds/245° F. | 0.09 | 3.47 | 1.80 | 1.64 | 2.27 | 15.21 | 12.49 |
| 9-6 | Permanax ™ + H-28 | 15 seconds/250° F. | 0.11 | 2.64 | 1.79 | — | 1.15 | — | — |
| 9-7 | Permanax ™ + CN-08 + H-28 | 15 seconds/245° F. | 0.11 | 4.08 | 1.97 | 1.90 | 2.65 | 17.21 | 25.62 |

EXAMPLE 10

To 15.0 g aliquots of Formulation C silver premix was added 1.0 g 2-butanone, 0.5 g methanol, and one of the following: one of the following:

$1.90 \times 10^{-3}$ moles H-10;

$2.02 \times 10^{-4}$ moles H-28;

$3.75 \times 10^{-5}$ moles CN-13 (−);

$7.51 \times 10^{-5}$ moles CN-13 (+);

a combination of $1.90 \times 10^{-3}$ moles H-10 and $3.75 \times 10^{-5}$ moles CN-13 (−);

a combination of $2.02 \times 10^{-4}$ moles H-28 and $7.51 \times 10^{-5}$ moles CN-13 (+).

A sample containing only Permanax™, a hindered bisphenol developer, served as a control.

The photothermographic emulsion layer and topcoat layer were dual-knife coated onto a 4 mil (101 μm) polyester support containing AH-2 in an antihalation backcoat. The first knife gap for the photothermographic emulsion layer was set to 1.9 mil (48.3 μm) above the support and the second knife gap for the topcoat layer was set at 2.7 mil (60.5 μm) above the support. Samples were dried for 5 minutes at 185° F. (85.0° C.) in a BlueM™ oven.

The sensitometric results, shown below, demonstrate an increase in Dmax, speed, and contrast upon combination of an acrylonitrile compound with a hydrazide/hindered bisphenol developer system.

a combination of $2.83 \times 10^{-5}$ moles H-14 and $2.01 \times 10^{-5}$ moles CN-08.

A sample containing only Permanax™, a hindered bisphenol developer, served as a control.

The photothermographic emulsion layer and topcoat layer were dual-knife coated onto a 4 mil (101 μm) polyester support containing AH-2 in an antihalation backcoat. The first knife gap for the photothermographic emulsion layer was set to 1.9 mil (48.3 μm) above the support and the second knife gap for the topcoat layer was set at 2.7 mil (60.5 μm) above the support. Samples were dried for 5 minutes at 185° F. (85.0° C.) in a BlueM™ oven.

The sensitometric results, shown below, demonstrate an increase in Dmax, speed, and contrast upon combination of an acrylonitrile compound with a hydrazide/hindered bisphenol developer system.

| Ex. | Developer | Processing Conditions | Dmin | Dmax | Speed-1 | Speed-3 | Contrast-A | Contrast-C | Contrast-D |
|---|---|---|---|---|---|---|---|---|---|
| 10-1 | Permanax ™ | 15 seconds/250° F. | 0.09 | 1.80 | 1.48 | — | 0.74 | — | — |
| 10-2 | Permanax ™ + CN-13 (−) | 15 seconds/250° F. | 0.10 | 2.15 | 1.73 | — | 1.05 | — | — |
| 10-3 | Permanax ™ + CN-13 (+) | 15 seconds/250° F. | 0.10 | 3.30 | 1.85 | — | 2.08 | 12.99 | — |
| 10-4 | Permanax ™ + H-28 | 15 seconds/250° F. | 0.11 | 2.64 | 1.79 | — | 1.15 | — | — |
| 10-5 | Permanax ™ + H-10 | 15 seconds/250° F. | 0.09 | 2.60 | 1.79 | — | 1.15 | — | — |
| 10-6 | Permanax ™ + H-10 + CN-13 (−) | 15 seconds/250° F. | 0.09 | 3.69 | 1.87 | 1.76 | 1.93 | 14.64 | 19.55 |
| 10-7 | Permanax ™ + H-28 + CN-13 (+) | 15 seconds/250° F. | 0.12 | 3.63 | 1.97 | 1.86 | 1.82 | 13.52 | 19.41 |

| Ex. | Developer | Processing Conditions | Dmin | Dmax | Speed-1 | Speed-3 | Contrast-A | Contrast-C | Contrast-D |
|---|---|---|---|---|---|---|---|---|---|
| 11-1 | Permanax™ | 15 seconds/245° F. | 0.08 | 1.65 | 1.26 | — | 0.76 | — | — |
| 11-2 | Permanax™ + CN-08 | 15 seconds/245° F. | 0.08 | 3.14 | 1.70 | — | 1.16 | 12.22 | — |
| 11-3 | Permanax™ + H-14 | 15 seconds/245° F. | 0.09 | 3.06 | 1.89 | — | 2.08 | 11.88 | — |
| 11-4 | Permanax™ + H-14 + CN-08 | 15 seconds/245° F. | 0.09 | 3.31 | 1.90 | 1.56 | 2.13 | 10.29 | 6.11 |

EXAMPLE 12

To 15.0 g aliquots of Formulation C silver premix was added 1.0 g 2-butanone, 0.5 g methanol, and one of the following:

1.90×10⁻³ moles H-10;

2.02×10⁻⁴ moles H-28;

2.01×10⁻⁵ moles CN-08 (−);

4.02×10⁻⁵ moles CN-08 (+);

a combination of 1.90×10⁻³ moles H-10 and 2.01×10⁻⁵ moles CN-08 (−);

a combination of 1.90×10⁻³ moles H-10 and 4.02×10⁻⁵ moles CN-08 (+);

a combination of 2.02×10⁻⁴ moles H-28 and 2.01×10⁻⁵ moles CN-08 (−);

a combination of 2.02×10⁻⁴ moles H-28 and 4.02×10⁻⁵ moles CN-08 (+).

A sample containing only Permanax™, a hindered bis-phenol developer, served as a control.

The photothermographic emulsion layer and topcoat layer were dual-knife coated onto a 4 mil (101 μm) polyester support containing AH-2 in an antihalation backcoat. The first knife gap for the photothermographic emulsion layer was set to 1.9 mil (48.3 μm) above the support and the second knife gap for the topcoat layer was set at 2.7 mil (60.5 μm) above the support. Samples were dried for 5 minutes at 185° F. (85.0° C.) in a BlueM™ oven.

The sensitometric results, shown below, demonstrate an increase in Dmax, speed, and contrast upon combination of an acrylonitrile compound with a hydrazide/hindered bisphenol developer.

What we claim is:

1. A black-and-white photothermographic element comprising a support bearing at least one photosensitive, image-forming, black-and-white photothermographic emulsion layer comprising:

(a) a photosensitive silver halide;
    (b) a non-photosensitive, reducible silver source;
    (c) a reducing agent system for silver ion; and
    (d) a binder, wherein the reducing agent system comprises:

(i) at least one hindered phenol;
    (ii) at least one acrylonitrile compound of the formula

wherein:

R represents a halogen atom, a hydroxy group, a thiohydrocarbyl group, a oxyhydrocarbyl group, or a metal salt of a hydroxy group; and X represents an electron withdrawing group.

2. The photothermographic element according to claim 1 wherein X represents an electron withdrawing group having a Hammett $\sigma_p$ value greater than about 0.20.

3. The photothermographic element according to claim 1 wherein X represents an electron withdrawing group having a Hammett $\sigma_p$ value greater than about 0.35.

4. The photothermographic element according to claim 1 wherein x is selected from the group consisting of cyano, halogen, formyl, alkoxycarbonyl, hydroxycarbonyl, metaloxycarbonyl, nitro, acetyl, perfluoroalkyl, alkylsulfonyl, and arylsulfonyl.

| Ex. | Developer | Processing Conditions | Dmin | Dmax | Speed-1 | Speed-3 | Contrast-A | Contrast-C | Contrast-D |
|---|---|---|---|---|---|---|---|---|---|
| 12-1 | Permanax™ | 15 seconds/250° F. | 0.08 | 1.57 | 1.37 | — | 0.78 | — | — |
| 12-2 | Permanax™ + CN-08 (−) | 15 seconds/250° F. | 0.09 | 3.41 | 1.81 | 1.67 | 1.79 | 13.68 | 14.42 |
| 12-3 | Permanax™ + CN-08 (+) | 15 seconds/250° F. | 0.08 | 3.57 | 1.86 | 1.77 | 2.35 | 17.57 | 22.20 |
| 12-4 | Permanax™ + H-10 | 15 seconds/250° F. | 0.08 | 2.96 | 1.74 | — | 1.15 | 11.92 | — |
| 12-5 | Permanax™ + H-28 | 15 seconds/250° F. | 0.10 | 2.76 | 1.78 | — | 1.15 | 8.25 | — |
| 12-6 | Permanax™ + H-10 + CN-08 (−) | 15 seconds/250° F. | 0.08 | 3.85 | 1.86 | 1.76 | 2.35 | 15.90 | 22.12 |
| 12-7 | Permanax™ + H-10 + CN-08 (+) | 15 seconds/250° F. | 0.09 | 4.08 | 1.94 | 1.85 | 2.45 | 16.81 | 24.56 |
| 12-8 | Permanax™ + H-28 + CN-08 (−) | 15 seconds/250° F. | 0.10 | 3.69 | 1.91 | 1.81 | 1.98 | 13.92 | 20.31 |
| 12-9 | Permanax™ + H-28 + CN-08 (+) | 15 seconds/250° F. | 0.13 | 4.33 | 1.94 | 2.03 | 2.08 | 14.31 | 23.69 |

Reasonable modifications and variations are possible from the foregoing disclosure without departing from either the spirit or scope of the present invention as defined by the claims.

5. The photothermographic element according to claim 1 wherein said non-photosensitive, reducible source of silver is a silver salt of a carboxylic acid having from 10 to 30 carbon atoms.

6. The photothermographic element according to claim 1 wherein said non-photosensitive silver source comprises silver behenate.

7. The photothermographic element according to claim 1 wherein said co-developer comprises a mixture of acrylonitrile compounds.

8. The photothermographic element according to claim 1 wherein said binder is hydrophobic.

9. The photothermographic element according to claim 1 wherein said hindered phenol is selected from the group consisting of binaphthols, biphenols, bis(hydroxynaphthyl)methanes, bis(hydroxyphenyl)methanes, and naphthols.

10. The photothermographic element according to claim 9 wherein said hindered phenol is a bis(hydroxyphenyl)methane.

11. The photothermographic element according to claim 1 wherein the reducing agent system further comprises at least one compound of the formula $$R^1-(C=O)-NHNH-R^2$$

wherein:

$R^1$ represents hydrogen and $R^2$ represents an aryl group; or, $R^1$ represents hydrogen, alkyl, or alkenyl groups of 1 to 20 carbon atoms; alkoxy, alkylthio, or amido groups of 1 to 20 carbon atoms; aryl, alkaryl, or aralkyl groups of up to 20 carbon atoms; aryloxy, arylthio, or anilino groups of up to 20 carbon atoms; aliphatic or aromatic heterocyclic ring groups containing up to 6 ring atoms; or carbocyclic ring groups comprising up to 6 ring carbon atoms; and $R^2$ represents a trityl group.

12. The photothermographic element according to claim 11 wherein $R^1$ represents an alkyl or alkenyl group of 1 to 10 carbon atoms; an alkoxy, alkylthio, or amido group of 1 to 10 carbon atoms; an aryl, alkaryl, or aralkyl group of up to 10 carbon atoms; or an aryloxy, arylthio, and anilino group of up to 10 carbon atoms; and $R^2$ represents a trityl group.

13. The photothermographic element according to claim 11 wherein $R^1$ represents an alkyl or alkenyl group of 1 to 5 carbon atoms; an alkoxy, alkylthio, or amido group of 1 to 5 carbon atoms; an aryl, alkaryl, or aralkyl group of up to 6 carbon atoms; or an aryloxy, arylthio, or anilino group of up to 6 carbon atoms; and $R^2$ represents a trityl group.

14. A process comprising the steps of:
(a) exposing the black-and-white photothermographic element of claim 1 on a support transparent to ultraviolet radiation or short wavelength visible radiation, to electromagnetic radiation to which the photosensitive silver halide of the black-and-while photothermographic element is sensitive to generate a latent image; and thereafter heating said black,and-white photothermographic element to form a visible image thereon;
(b) positioning said black-and-white photothermographic element with a visible image thereon between a source of ultraviolet or short wavelength visible radiation and an ultraviolet or short wavelength visible radiation photosensitive imageable medium; and
(c) then exposing said ultraviolet or short wavelength visible radiation sensitive imageable medium to ultraviolet or short wavelength visible radiation through said visible image on said black-and-white photothermographic element, thereby absorbing ultraviolet or short wavelength visible radiation in the areas of said black-and-white photothermographic element where there is a visible image and transmitting ultraviolet or short wavelength visible radiation where there is no visible image on said black-and-white photothermographic element.

15. The process of claim 14 wherein said imageable medium is a resist developable, ultraviolet or short wavelength visible radiation sensitive imageable medium.

16. The process of claim 14 wherein said exposing of said element in step (a) is done with a red or infrared emitting laser or red or infrared emitting laser diode.

17. A process comprising the steps of:
(a) exposing the black-and-white photothermographic element of claim 11 on a support transparent to ultraviolet radiation or short wavelength visible radiation, to electromagnetic radiation to which the photosensitive silver halide of the black-and-white photothermographic element is sensitive to generate a latent image; and thereafter heating said black-and-white photothermographic element to form an element with a visible image thereon;
(b) positioning said black-and-white photothermographic element with a visible image thereon between a source of ultraviolet or short wavelength visible radiation and an ultraviolet or short wavelength visible radiation photosensitive imageable medium; and
(c) then exposing said ultraviolet or short wavelength visible radiation sensitive imageable medium to ultraviolet or short wavelength visible radiation through said black-and-white photothermographic element with a visible image, thereby absorbing ultraviolet or short wavelength visible radiation in the areas of said black-and-white photothermographic element where there is a visible image and transmitting ultraviolet or short wavelength visible radiation where there is no visible image on said black-and-white photothermographic element.

18. The process of claim 17 wherein said imageable medium is a resist developable, ultraviolet or short wavelength visible radiation sensitive imageable medium.

19. The process of claim 17 wherein said exposing of said black-and-white photothermographic element in step (a) is done with a red or infrared emitting laser or red or infrared emitting laser diode.

20. The process of claim 17 wherein said ultraviolet or short wavelength visible radiation sensitive imageable medium is a printing plate, a contact proof, or a duplicating film.

21. A black-and-white thermographic element comprising a support bearing at least one, image-forming, black-and-white thermographic emulsion layer comprising:
(a) a non-photosensitive, reducible silver source;
(b) a reducing agent system for silver ion; and
(c) a binder;
wherein said reducing agent system comprises:
(i) at least one hindered phenol;
(ii) at least one co-developer of the formula

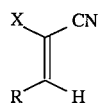

wherein:
R represents a halogen atom, a hydroxy group, a thiohydrocarbyl group, a oxyhydrocarbyl group, or a metal salt of a hydroxy group, and X represents an electron withdrawing group.

22. The thermographic element according to claim 21 wherein X represents an electron withdrawing group having a Hammett $\sigma_p$ value greater than about 0.20.

23. The thermographic element according to claim 21 wherein X represents an electron withdrawing group having a Hammett $\sigma_p$ value greater than about 0.35.

24. The thermographic element according to claim 21 wherein X is selected from the group consisting of cyano, halogen, formyl, alkoxycarbonyl, hydroxycarbonyl, metaloxycarbonyl, nitro, acetyl, perfluoroalkyl, alkylsulfonyl, and arylsulfonyl.

25. The thermographic element according to claim 21 wherein said non-photosensitive, reducible source of silver is a silver salt of a carboxylic acid having from 10 to 30 carbon atoms.

26. The thermographic element according to claim 21 wherein said non-photosensitive silver source comprises silver behenate.

27. The thermographic element according to claim 21 wherein said co-developer comprises a mixture of acrylonitrile compounds.

28. The thermographic element according to claim 21 wherein said hindered phenol is selected from the group consisting of binaphthols, biphenols, bis(hydroxynaphthyl)-methanes, bis(hydroxyphenyl)methanes, and naphthols.

29. The thermographic element according to claim 28 wherein said hindered phenol is a bis(hydroxyphenyl)methane.

30. The thermographic element according to claim 21 wherein the reducing agent system further comprises at least one compound of the formula

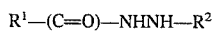

wherein:
- $R^1$ represents hydrogen and $R^2$ represents an aryl or substituted aryl group; or,
- $R^1$ represents hydrogen, alkyl, or alkenyl groups of 1 to 20 carbon atoms; alkoxy, alkylthio, or amido groups of 1 to 20 carbon atoms; aryl, alkaryl, or aralkyl groups of up to 20 carbon atoms; aryloxy, arylthio, or anilino groups of up to 20 carbon atoms; aliphatic or aromatic heterocyclic ring groups containing up to 6 ring atoms; or carbocyclic ring groups comprising up to 6 ring carbon atoms; and $R^2$ represents a trityl group.

31. The thermographic element according to claim 30 wherein $R^1$ represents an alkyl or alkenyl group of 1 to 10 carbon atoms; an alkoxy, alkylthio, or amido group of 1 to 10 carbon atoms; an aryl, alkaryl, or aralkyl group of up to 10 carbon atoms; or an aryloxy, arylthio, and anilino group of up to 10 carbon atoms; and $R^2$ represents a trityl group.

32. A process comprising the steps of:
(a) heating the black-and-white thermographic element of claim 21 on a support transparent to ultraviolet radiation or short wavelength visible radiation, to form a visible image thereon;
(b) positioning said black-and-white thermographic element with a visible image thereon between a source of ultraviolet or short wavelength visible radiation and an ultraviolet or short wavelength visible radiation photosensitive imageable medium; and
(c) then exposing said ultraviolet or short wavelength visible radiation sensitive imageable medium to ultraviolet or short wavelength visible radiation through said visible image on said black-and-white thermographic element, thereby absorbing ultraviolet or short wavelength visible radiation in the areas of said black-and-white thermographic element where there is a visible image and transmitting ultraviolet or short wavelength visible radiation where there is no visible image on said black-and-white thermographic element.

33. The process of claim 32 wherein said imageable medium is a resist developable, ultraviolet or short wavelength visible radiation sensitive imageable medium.

34. The process of claim 32 wherein said heating of the black-and-white thermographic element is done with a red or infrared emitting laser or red or infrared emitting laser diode.

35. The process of claim 32 wherein said ultraviolet or short wavelength visible radiation sensitive imageable medium is a printing plate, a contact print film, or a duplicating film.

36. A process comprising the steps of:
(a) heating the black-and-white thermographic element of claim 30 on a support transparent to ultraviolet radiation or short wavelength visible radiation, to form a black-and-white thermographic element having a visible image thereon;
(b) positioning said black-and-white thermographic element having a visible image thereon between a source of ultraviolet or short wavelength visible radiation and an ultraviolet or short wavelength visible radiation photosensitive imageable medium; and
(c) then exposing said ultraviolet or short wavelength visible radiation sensitive imageable medium to ultraviolet or short wavelength visible radiation through said black-and-white thermographic element having a visible image, thereby absorbing ultraviolet or short wavelength visible radiation in the areas of said black-and-white thermographic element where there is a visible image and transmitting ultraviolet or short wavelength visible radiation where there is no visible image on said black-and-white thermographic element having a visible image.

* * * * *